United States Patent
Chien et al.

(10) Patent No.: US 12,407,337 B2
(45) Date of Patent: *Sep. 2, 2025

(54) FLIP-FLOP CIRCUIT AND METHOD

(71) Applicant: TAIWAN SEMICONDUCTOR MANUFACTURING COMPANY, LTD., Hsinchu (TW)

(72) Inventors: Yung-Chen Chien, Hsinchu (TW); Xiangdong Chen, Hsinchu (TW); Hui-Zhong Zhuang, Hsinchu (TW); Tzu-Ying Lin, Hsinchu (TW); Jerry Chang Jui Kao, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/768,843

(22) Filed: Jul. 10, 2024

(65) Prior Publication Data

US 2024/0364317 A1  Oct. 31, 2024

Related U.S. Application Data

(63) Continuation of application No. 18/302,178, filed on Apr. 18, 2023, now Pat. No. 12,047,079, which is a
(Continued)

(51) Int. Cl.
*H03K 3/3562* (2006.01)
*H03K 3/012* (2006.01)
*H03K 3/037* (2006.01)

(52) U.S. Cl.
CPC ......... *H03K 3/35625* (2013.01); *H03K 3/012* (2013.01); *H03K 3/0372* (2013.01); *H03K 3/0375* (2013.01)

(58) Field of Classification Search
CPC .... H03K 3/012; H03K 3/0372; H03K 3/0375; H03K 3/3562; H03K 3/35625
See application file for complete search history.

(56) References Cited

U.S. PATENT DOCUMENTS

| 5,202,908 A | 4/1993 | Hatada |
| 8,421,513 B2 | 4/2013 | Pal |

(Continued)

FOREIGN PATENT DOCUMENTS

| JP | 2010183541 | 8/2010 |
| KR | 20010020993 | 3/2001 |
| TW | 201547201 | 12/2015 |

OTHER PUBLICATIONS

Office Action dated Apr. 28, 2022 for corresponding case No. TW 11120422080. (pp. 1-5).

(Continued)

*Primary Examiner* — Patrick O'Neill
(74) *Attorney, Agent, or Firm* — Hauptman Ham, LLP

(57) ABSTRACT

A flip-flop circuit includes a first inverter configured to receive a first clock signal and output a second clock signal, a second inverter configured to receive the second clock signal and output a third clock signal, a master latch including a transmission circuit, and a slave latch including a first feedback inverter. The first feedback inverter includes a first transistor configured to receive the first clock signal and a second transistor configured to receive the second clock signal, and the transmission circuit includes a third transistor configured to receive the third clock signal.

20 Claims, 13 Drawing Sheets

Related U.S. Application Data continuation of application No. 17/338,199, filed on Jun. 3, 2021, now Pat. No. 11,632,102.

(60) Provisional application No. 63/142,880, filed on Jan. 28, 2021.

(56) References Cited

U.S. PATENT DOCUMENTS

| | | | |
|---|---|---|---|
| 11,303,267 B2 * | 4/2022 | Cai | H03K 3/3562 |
| 11,632,102 B2 | 4/2023 | Chien et al. | |
| 12,047,079 B2 * | 7/2024 | Chien | H03K 3/0372 |
| 2003/0107421 A1 | 6/2003 | Markovic et al. | |
| 2010/0060321 A1 | 3/2010 | Kvinta et al. | |
| 2012/0032720 A1 | 2/2012 | Sofer | |
| 2014/0040688 A1 | 2/2014 | Zhang et al. | |
| 2015/0381154 A1 | 12/2015 | Maeno | |
| 2020/0389155 A1 | 12/2020 | Gupta | |

OTHER PUBLICATIONS

Notice of Allowance issued in corresponding TW application No. 10-2021-0099719 dated Jun. 19, 2023.

* cited by examiner

FLIP-FLOP CIRCUIT AND METHOD

CROSS-REFERENCE TO RELATED APPLICATIONS

The present application is a continuation of U.S. application Ser. No. 18/302,178, filed Apr. 18, 2023, now U.S. Pat. No. 12,047,079, issued Jul. 23, 2024, which is a continuation of U.S. application Ser. No. 17/338,199, filed Jun. 3, 2021, now U.S. Pat. Nos. 11,632,192, issued Apr. 18, 2023, which claims the priority of U.S. Provisional Application No. 63/142,880, filed Jan. 28, 2021, each of which is incorporated herein by reference in its entirety.

BACKGROUND

The present disclosure relates, in general, to semiconductor devices and methods for operating the same.

A flip-flop is a device which can store a single bit of data, with one of two states representing "one" and the other "zero." Such data storage can be used for storage of state, and such a circuit can be described as sequential logic in electronics. A D-type flip-flop is widely used as the basic building block of random access memory (RAM) and registers. The D-type flip-flop captures the D-input value at the specified edge (i.e., rising or falling) of the clock. After the rising/falling clock edge, the captured value is available at Q output. In some approaches, flip-flop circuits are limited in terms of both minimum operating voltage and energy dissipation during operation. Data may not be correctly stored in the flip-flop if operated at a voltage lower than its minimum operating voltage.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
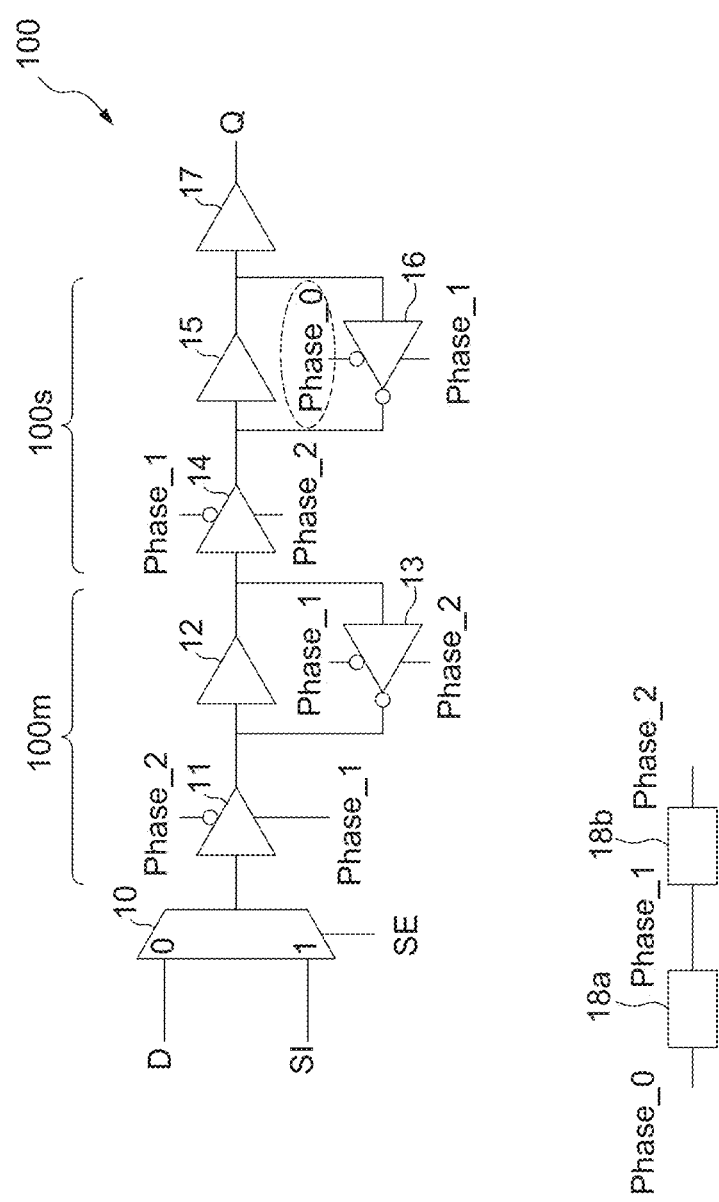
FIG. 1A is a schematic view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Techniques disclosed in the present disclosure provide numerous solutions, for a flip-flop to have fewer clocked transistors, shorter circuit propagation delays, improved minimum operating voltage, and lower power consumption than a flip-flop configured based on other approaches.

FIG. 1A illustrates a schematic view of a semiconductor device, in accordance with some embodiments of the present disclosure.

FIG. 1A shows a device 100. The device 100 can be an electrical device. The device 100 can be a semiconductor device. The device 100 can be a system of integrated circuits (IC). The device 100 can be a flip-flop. The device 100 includes a multiplexing device 10, a master stage 100*m*, a slave stage 100*s*, and an output device 17. The multiplexing device 10 includes input terminals for receiving signals SE, SI and D. The master stage 100*m* can also be referred to as a latching circuit. The slave stage 100*s* can also be referred to as a latching circuit.

The multiplexing device 10 is configured to select between the signal SI or the signal D based on the signal SE. In some embodiments, the multiplexing device 10 is configured to select the signal SI if the signal SE has a logic high value (for example, "1"), and to select the signal D if the signal SE has a logic low value (for example, "0").

The master stage 100*m* includes a transmission circuit 11, a phase shift circuit 12, and a feedback circuit 13. The transmission circuit 11 is electrically connected to the phase shift circuit 12 and the feedback circuit 13. The transmission circuit 11 is coupled to the phase shift circuit 12 and the feedback circuit 13. The output terminal of the phase shift circuit 12 is electrically connected to the input terminal of the feedback circuit 13. The output terminal of the feedback circuit 13 is electrically connected to the input terminal of the phase shift circuit 12.

In the present disclosure, the term "electrically connected to" and the term "coupled to" can refer to the same meaning, and may be used interchangeably.

The transmission circuit 11 includes two input terminals configured to receive clock signals Phase_1 and Phase_2. The feedback circuit 13 includes two input terminals configured to receive clock signals Phase_1 and Phase_2. In some embodiments, the feedback circuit 13 is configured to be turned off by the clock signals Phase_1 and Phase_2 prior to the transmission circuit 11 turning on, such that the signals received by the master stage 100*m* can be correctly transmitted to the slave stage 100*s*.

If the feedback circuit 13 is kept on while the transmission circuit 11 is turned on, the signals transmitted by the master stage 100*m* to the slave stage 100*s* may be adversely affected, and as a result the device 100 may not be able to operate as expected. While the transmission circuit 11 is on, the feedback circuit 13 can be expected to be completely turned off so as to not affect the operation of the device 100.

The slave stage 100*s* includes a transmission circuit 14, a phase shift circuit 15, and a feedback circuit 16. The transmission circuit 14 is electrically connected to the phase shift circuit 15 and the feedback circuit 16. The output terminal of the phase shift circuit 15 is electrically connected to the input terminal of the feedback circuit 16. The output terminal of the feedback circuit 16 is electrically connected to the input terminal of the phase shift circuit 15.

The transmission circuit 14 includes two input terminals configured to receive clock signals Phase_1 and Phase_2. The feedback circuit 16 includes two input terminals configured to receive clock signals Phase_0 and Phase_1. In some embodiments, the feedback circuit 16 is configured to be turned off by the clock signals Phase_0 and Phase_1 prior to the transmission circuit 14 being turned on by the clock signals Phase_1 and Phase_2, such that the signals received by the slave stage 100*s* can be correctly transmitted to the output device 17.

If the feedback circuit 16 is on while the transmission circuit 14 is also on, the signals transmitted by the slave stage 100*s* to the output device 17 may be adversely affected, and as a result the device 100 may not be able to operate as expected. While the transmission circuit 14 is on, the feedback circuit 16 can be expected to be completely turned off so as to not affect the operation of the device 100. This can be achieved by the configuration shown in FIG. 1A, in which the feedback circuit 16 is controlled by signals (e.g., Phase_0 and Phase_1) that are more advanced in timing than the signals (e.g., Phase_1 and Phase_2) for controlling the transmission circuit 14.

Referring to FIG. 1A, the device 100 may further include phase shift circuits 18*a* and 18*b*. The phase shift circuit 18*a* is configured to receive the clock signal Phase_0 and then provide the clock signal Phase_1. The phase shift circuit 18*b* is configured to receive the clock signal Phase_1 and then provide the clock signal Phase_2. A phase-shift quantity exists between the clock signals Phase_1 and Phase_0. A phase-shift quantity exists between the clock signals Phase_2 and Phase_1. In some embodiments, the phase shift circuit 18*a* is an inverter. In some embodiments, phase shift circuit 18*b* is an inverter.

The transmission circuit 11 of the master stage 100*m* and the transmission circuit 14 of the slave stage 100*s* are controlled by identical clock signals (i.e., Phase_1 and Phase_2). The feedback circuit 13 of the master stage 100*m* and the feedback circuit 16 of the slave stage 100*s* are controlled by different clock signals. That is, although the clock signal Phase_1 is fed to both the feedback circuits 13 and 16, the clock signal Phase_0 is utilized to control the feedback circuit 16 only, while the clock signal Phase_2 is utilized to control the feedback circuit 13 only.

By controlling the feedback circuit 16 with appropriate clock signals, signal conflicts/jitters between the master stage 100*m* and the slave stage 100*s* can be prevented. By turning off the feedback circuit 16 prior to the transmission circuit 14 being turned on, signal conflicts/jitters between the master stage 100*m* and the slave stage 100*s* can be prevented. As a result, compared to other approaches, the device 100 improves Vmin, by around 25 mV to 50 mV. That is, the device 100 can operate properly at lower voltage. The decreased Vmin allows device 100 to be widely used in common semiconductor systems.

Figure 1B:
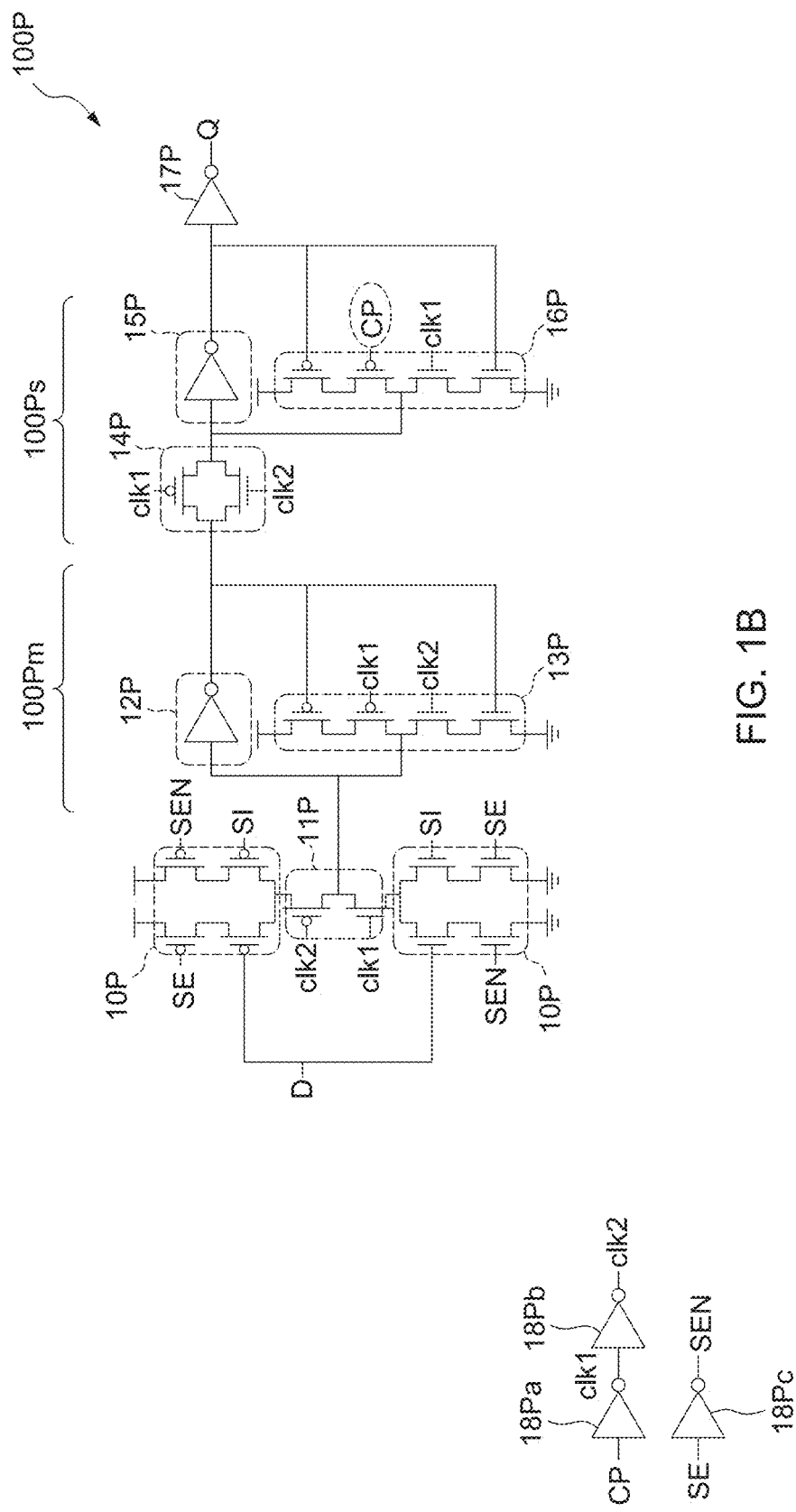
FIG. 1B is a schematic view of a semiconductor device, in accordance with some embodiments of the present disclosure.

FIG. 1B illustrates a schematic view of a semiconductor device, in accordance with some embodiments of the present disclosure.

FIG. 1B shows a device 100P. The device 100P can be an electrical device. The device 100P can be a semiconductor device. The device 100P can be a system of integrated circuits (IC). The device 100P can be a flip-flop. The device 100P can be a rising-edge triggering flip-flop. The device 100P can be an embodiment corresponding to the device 100.

The device 100P includes a multiplexing device 10P, a master stage 100Pm, a slave stage 100Ps, and an output device 17P. The multiplexing device 10P includes input terminals for receiving signals SE, SEN, SI and D. The master stage 100Pm can also be referred to as a latching circuit. The slave stage 100Ps can also be referred to as a latching circuit.

The multiplexing device 10P is configured to select between the signal SI or the signal D based on the signals SE and SEN. In some embodiments, the multiplexing device 10P is configured to select the signal SI if the signal SE has a logic high value (for example, "1") and the signal SEN has a logic low value (for example, "0"), and to select the signal D if the signal SE has the logic low value and the signal SEN has the logic high value.

The device 100P may further include phase shift circuits 18Pa, 18Pb and 18Pc. The phase shift circuit 18Pa is configured to receive a clock signal CP and then provide a clock signal clk1. The phase shift circuit 18Pb is configured to receive the clock signal clk1 and then provide a clock signal clk2. A phase-shift quantity exists between the clock signals clk1 and CP. A phase-shift quantity exists between the clock signals clk2 and clk1. In some embodiments, the phase shift circuit 18Pa is an inverter. In some embodiments, the phase shift circuit 18Pb is an inverter.

The phase shift circuit 18Pc is configured to receive the signal SE and then provide the signal SEN. A phase-shift quantity exists between the signals SE and SEN. In some embodiments, the phase shift circuit 18Pc is an inverter. In some embodiments, the signal SEN corresponds to an inversion of the signal SE.

The master stage 100Pm includes a transmission circuit 11P, a phase shift circuit 12P, and a feedback circuit 13P. The transmission circuit 11P is electrically connected to the phase shift circuit 12P and the feedback circuit 13P. The output terminal of the phase shift circuit 12P is electrically connected to the input terminals of the feedback circuit 13P. The output terminal of the feedback circuit 13P is electrically connected to the input terminal of the phase shift circuit 12P.

The transmission circuit 11P includes two input terminals configured to receive clock signals clk1 and clk2. The feedback circuit 13P includes two input terminals configured to receive clock signals clk1 and clk2. In some embodiments, the feedback circuit 13P is configured to be turned off by the clock signals clk1 and clk2 prior to the transmission circuit 11P is turned on, such that the signals received by the master stage 100Pm can be correctly transmitted to the slave stage 100Ps.

If the feedback circuit 13P is kept on while the transmission circuit 11P is turned on, the signals transmitted by the master stage 100Pm to the slave stage 100Ps may be adversely affected, and as a result the device 100P may not be able to operate as expected. While the transmission circuit 11P is on, the feedback circuit 13P can be expected to be completely turned off so as to not affect the operation of the device 100P.

The slave stage 100Ps includes a transmission circuit 14P, a phase shift circuit 15P, and a feedback circuit 16P. The transmission circuit 14P is electrically connected to the phase shift circuit 15P and the feedback circuit 16P. The output terminal of the phase shift circuit 15P is electrically connected to the input terminals of the feedback circuit 16P. The output terminal of the feedback circuit 16P is electrically connected to the input terminal of the phase shift circuit 15P.

The transmission circuit 14P includes two input terminals configured to receive clock signals clk1 and clk2. The feedback circuit 16P includes two input terminals configured to receive clock signals CP and clk1. In some embodiments, the feedback circuit 16P is configured to be turned off by the clock signals CP and clk1 prior to the transmission circuit 14P being turned on by the clock signals clk1 and clk2, such that the signals received by the slave stage 100Ps can be correctly transmitted to the output device 17P.

If the feedback circuit 16P is kept on while the transmission circuit 14P is turned on, the signals transmitted by the slave stage 100Ps to the output device 17P may be adversely affected, and as a result the device 100P may not be able to operate as expected. While the transmission circuit 14P is on, the feedback circuit 16P can be expected to be completely turned off so as to not affect the operation of the device 100P. This can be achieved by the configuration shown in FIG. 1B in which the feedback circuit 16P is controlled by signals (e.g., CP and clk1) more advanced in timing than the signals (e.g., clk1 and clk2) for controlling the transmission circuit 14P.

By controlling the feedback circuit 16P with appropriate clock signals, signal conflicts/jitters between the master stage 100Pm and the slave stage 100Ps can be prevented. By turning off the feedback circuit 16P prior to the transmission circuit 14P being turned on, signal conflicts/jitters between the master stage 100Pm and the slave stage 100Ps can be prevented. As a result, compared to other approaches, the device 100P improves Vmin, for around 25 mV to 50 mV. That is, the device 100P can operate properly at lower voltage. The decreased Vmin allows device 100P to be widely used in common semiconductor systems.

Figure 1C:
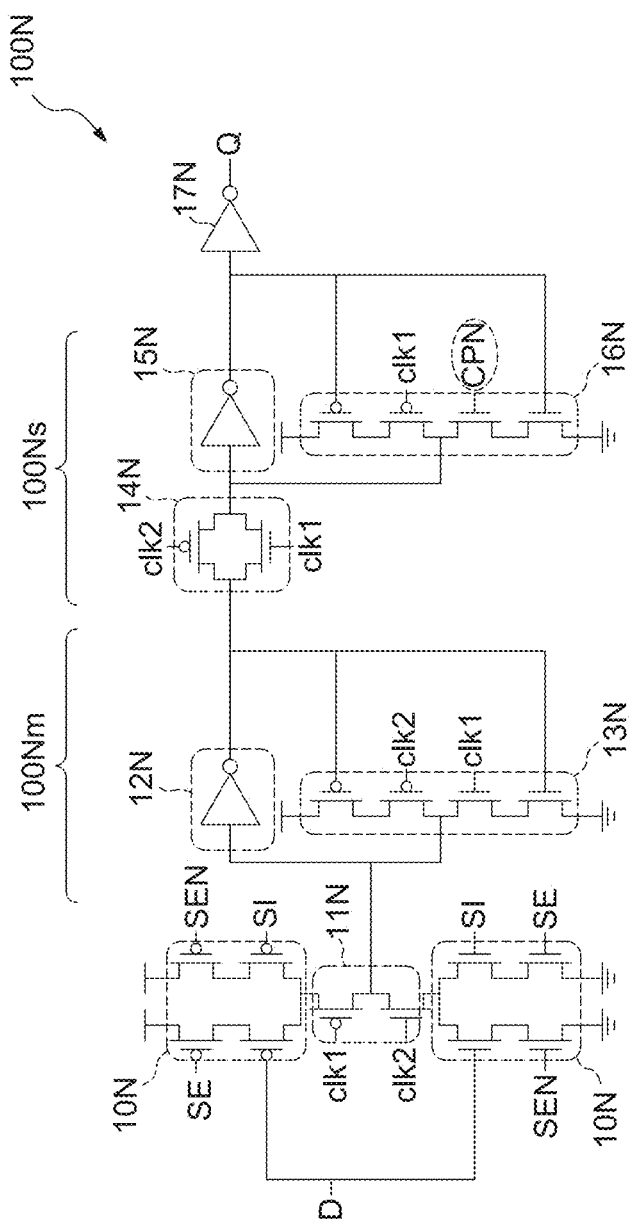
FIG. 1C is a schematic view of a semiconductor device, in accordance with some embodiments of the present disclosure.
Figure 1C:
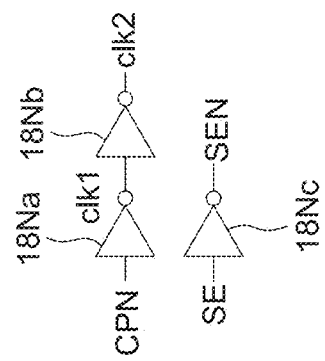

FIG. 1C illustrates a schematic view of a semiconductor device, in accordance with some embodiments of the present disclosure.

FIG. 1C shows a device 100N. The device 100N can be an electrical device. The device 100N can be a semiconductor device. The device 100N can be a system of integrated circuits (IC). The device 100N can be a flip-flop. The device 100N can be a falling-edge triggering flip-flop. The device 100N can be an embodiment corresponding to the device 100.

The device 100N includes a multiplexing device 10N, a master stage 100Nm, a slave stage 100Ns, and an output device 17N. The multiplexing device 10N corresponds to multiplexing device 10P discussed above with respect to FIG. 1B. The master stage 100Nm can also be referred to as a latching circuit. The slave stage 100Ns can also be referred to as a latching circuit.

The device 100N may further include phase shift circuits 18Na, 18Nb and 18Nc. The phase shift circuit 18Na is configured to receive a clock signal CPN and then provide the clock signal clk1. The phase shift circuit 18Nb is configured to receive the clock signal clk1 and then provide the clock signal clk2. A phase-shift quantity exists between the clock signals clk1 and CPN. A phase-shift quantity exists between the clock signals clk2 and clk1. In some embodiments, the phase shift circuit 18Na is an inverter. In some embodiments, the phase shift circuit 18Nb is an inverter.

The clock signal CPN shown in FIG. 1C can correspond to an inversion of the clock signal CP shown in FIG. 1B. A phase-shift quantity may exist between the clock signal CPN shown in FIG. 1C and the clock signal CP shown in FIG. 1B.

In some embodiments, the phase shift circuit 18Nc is configured to receive the signal SE and then provide the signal SEN. A phase-shift quantity exists between the signals SE and SEN. In some embodiments, the phase shift circuit 18Nc is an inverter. In some embodiments, the signal SEN corresponds to an inversion of the signal SE.

The master stage 100Nm includes a transmission circuit 11N, a phase shift circuit 12N, and a feedback circuit 13N. The transmission circuit 11N is electrically connected to the phase shift circuit 12N and the feedback circuit 13N. The transmission circuit 11N is coupled to the phase shift circuit 12N and the feedback circuit 13N. The output terminal of the phase shift circuit 12N is electrically connected to the input terminals of the feedback circuit 13N. The output terminal of the feedback circuit 13N is electrically connected to the input terminal of the phase shift circuit 12N.

The transmission circuit 11N includes two input terminals configured to receive clock signals clk1 and clk2. The feedback circuit 13N includes two input terminals configured to receive clock signals clk1 and clk2. In some embodiments, the feedback circuit 13N is configured to be turned off by the clock signals clk1 and clk2 prior to the transmission circuit 11N being turned on, such that the signals received by the master stage 100Nm can be correctly transmitted to the slave stage 100Ns.

If the feedback circuit 13N is kept on while the transmission circuit 11N is turned on, the signals transmitted by the master stage 100Nm to the slave stage 100Ns may be adversely affected, and as a result the device 100N may not be able to operate as expected. While transmission circuit 11N is on, the feedback circuit 13N can be expected to be completely turned off so as to not affect the operation of the device 100N.

The slave stage 100Ns includes a transmission circuit 14N, a phase shift circuit 15N, and a feedback circuit 16N. The transmission circuit 14N is electrically connected to the phase shift circuit 15N and the feedback circuit 16N. The output terminal of the phase shift circuit 15N is electrically connected to the input terminals of the feedback circuit 16N. The output terminal of the feedback circuit 16N is electrically connected to the input terminal of the phase shift circuit 15N.

The transmission circuit 14N includes two input terminals configured to receive clock signals clk1 and clk2. The feedback circuit 16N includes two input terminals configured to receive clock signals CPN and clk1. In some embodiments, the feedback circuit 16N is configured to be turned off by the clock signals CPN and clk1 prior to the transmission circuit 14N being turned on by the clock signals clk1 and clk2, such that the signals received by the slave stage 100Ns can be correctly transmitted to the output device 17N.

If the feedback circuit 16N is kept on while the transmission circuit 14N is turned on, the signals transmitted by the slave stage 100Ns to the output device 17N may be adversely affected, and as a result the device 100N may not be able to operate as expected. While the transmission circuit 14N is on, the feedback circuit 16N can be expected to be completely turned off so as to not affect the operation of the device 100N. This can be achieved by the configuration shown in FIG. 1C, in which the feedback circuit 16N is controlled by signals (e.g., CPN and clk1) more advanced in timing than the signals (e.g., clk1 and clk2) for controlling the transmission circuit 14N.

By controlling the feedback circuit 16N with appropriate clock signals, signal conflicts/jitters between the master stage 100Nm and the slave stage 100Ns can be prevented. By turning off the feedback circuit 16N prior to the transmission circuit 14N being turned on, signal conflicts/jitters between the master stage 100Nm and the slave stage 100Ns can be prevented. As a result, compared to other approaches, the device 100N improves Vmin, for around 25 mV to 50 mV. That is, the device 100N can operate properly at lower voltage. The decreased Vmin allows device 100N to be widely used in common semiconductor systems.

Figure 1D:
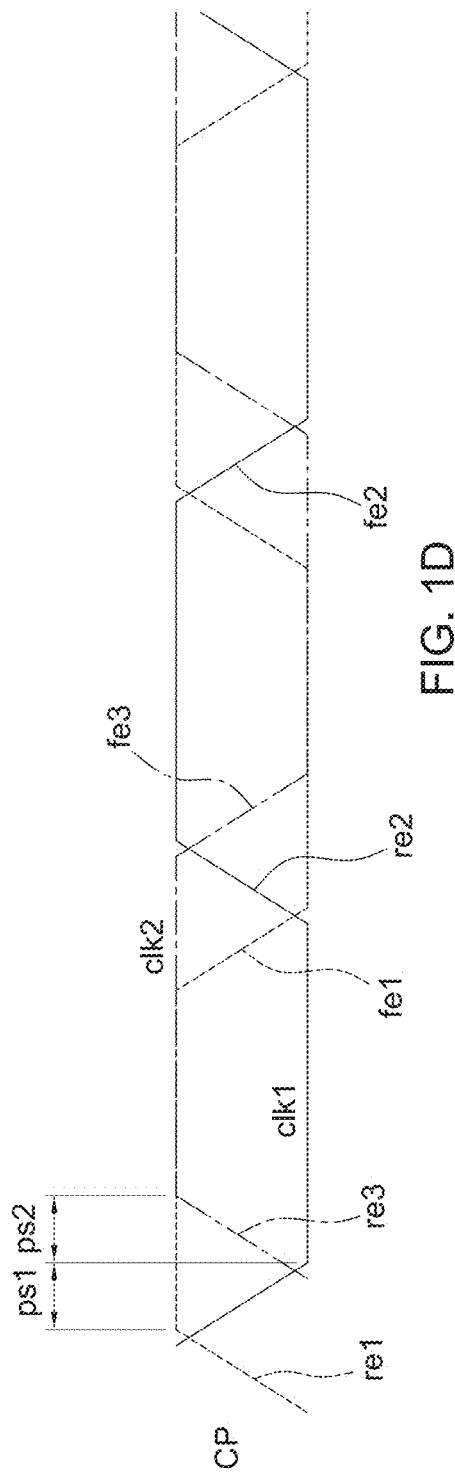
FIG. 1D illustrates waveforms of clock signals, in accordance with some embodiments of the present disclosure.

FIG. 1D illustrates waveforms of clock signals, in accordance with some embodiments of the present disclosure. FIG. 1D shows waveforms of the clock signals CP, clk1 and clk2. A phase-shift quantity ps1 exists between the clock signal CP and the clock signal clk1. A phase-shift quantity ps2 exists between the clock signal clk1 and the clock signal clk2. As shown in FIG. 1D, the waveform of the clock signal CP includes a rising edge re1 and a falling edge fe1. The waveform of the clock signal clk1 includes a rising edge re2 and a falling edge fe2. The waveform of the clock signal clk2 includes a rising edge re3 and a falling edge fe3.

Figure 1E:
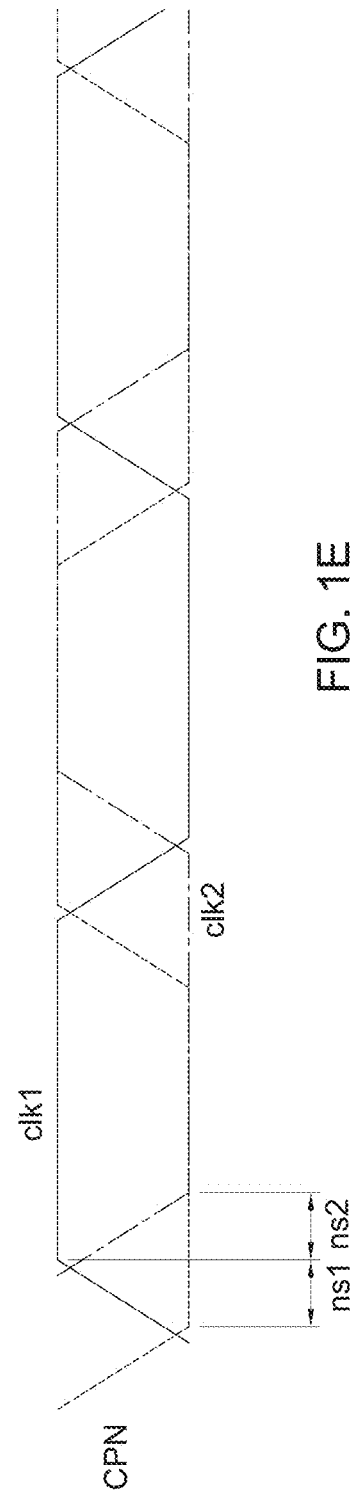
FIG. 1E illustrates waveforms of clock signals, in accordance with some embodiments of the present disclosure.

FIG. 1E illustrates waveforms of clock signals, in accordance with some embodiments of the present disclosure.

FIG. 1E shows waveforms of the clock signals CPN, clk1 and clk2. A phase-shift quantity ns1 exists between the clock signal CPN and the clock signal clk1. A phase-shift quantity ns2 exists between the clock signal clk1 and the clock signal clk2.

Figure 2A:
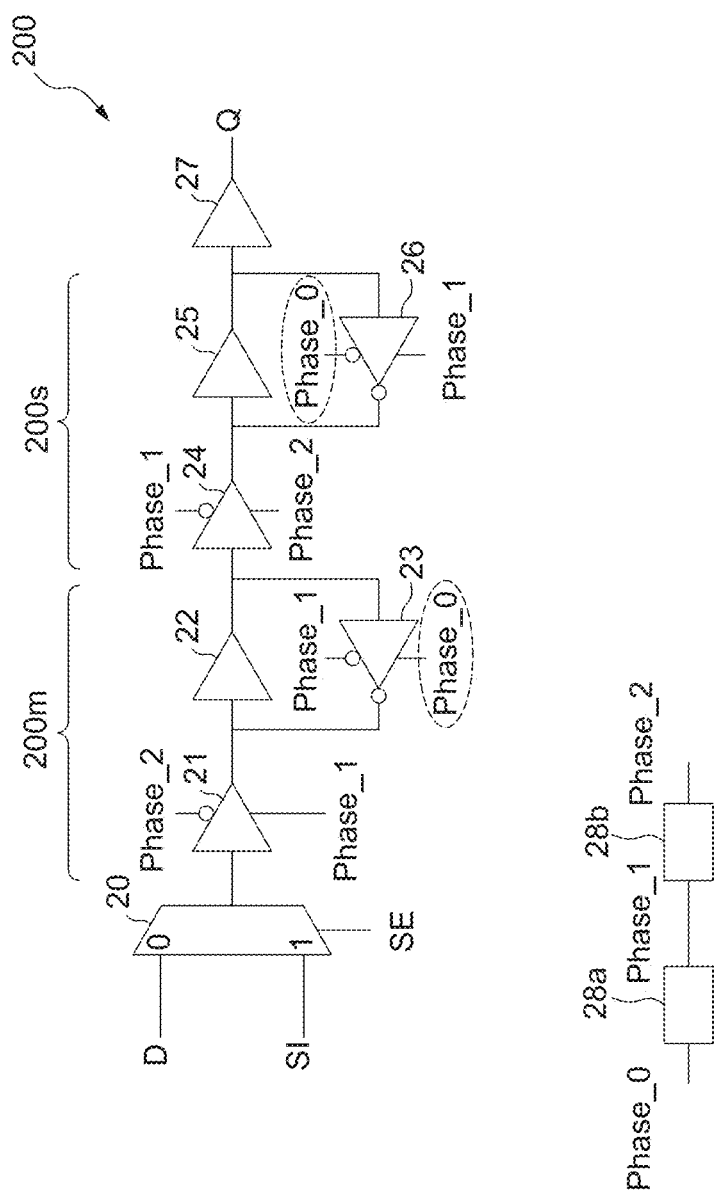
FIG. 2A is a schematic view of a semiconductor device, in accordance with some embodiments of the present disclosure.

FIG. 2A illustrates a schematic view of a semiconductor device, in accordance with some embodiments of the present disclosure.

FIG. 2A shows a device 200. The device 200 can be an electrical device. The device 200 can be a semiconductor device. The device 200 can be a system of integrated circuits (IC). The device 200 can be a flip-flop. The device 200 includes a multiplexing device 20, a master stage 200m, a slave stage 200s, and an output device 27. The multiplexing device 20 includes input terminals for receiving signals SE, SI and D.

The master stage 200m includes a transmission circuit 21, a phase shift circuit 22, and a feedback circuit 23. The master stage 200m can also be referred to as a latching circuit. The slave stage 200s includes a transmission circuit 24, a phase shift circuit 25, and a feedback circuit 26. The slave stage 200s can also be referred to as a latching circuit. The device 200 may further include phase shift circuits 28a and 28b. The phase shift circuit 28a is configured to receive the clock signal Phase_0 and then provide the clock signal Phase_1. The phase shift circuit 28b is configured to receive the clock signal Phase_1 and then provide the clock signal Phase_2.

The transmission circuit 21, the phase shift circuit 22, and the feedback circuit 23 of the master stage 200m of FIG. 2A are configured similar to the transmission circuit 11, the phase shift circuit 12, and the feedback circuit 13 of the master stage 100m of FIG. 1A, except that the input signals of the feedback circuit 23 are different than those of the feedback circuit 13.

Referring to FIG. 2A, the feedback circuit 23 is configured to receive the clock signals Phase_0 and Phase_1, while the feedback circuit 13 of FIG. 1A is configured to receive the clock signals Phase_1 and Phase_2.

In some embodiments, the feedback circuit 23 is configured to be turned off by the clock signals Phase_0 and Phase_1 prior to the transmission circuit 21 being turned on by the clock signals Phase_1 and Phase_2, such that the signals received by the master stage 200m can be correctly transmitted to the slave stage 200s.

If the feedback circuit 23 is kept on while the transmission circuit 21 is turned on, the signals transmitted by the master stage 200m to the slave stage 200s may be adversely affected, and as a result the device 200 may not be able to operate as expected. While transmission circuit 21 is on, the feedback circuit 23 can be expected to be completely turned off so as to not affect the operation of the device 200. This can be achieved by the configuration shown in FIG. 2A, in which the feedback circuit 23 is controlled by signals (e.g., Phase_0 and Phase_1) more advanced in timing than the signals (e.g., Phase_1 and Phase_2) for controlling the transmission circuit 21.

The transmission circuit 24, the phase shift circuit 25, and the feedback circuit 26 of the slave stage 200s of FIG. 2A are configured similar to the transmission circuit 14, the phase shift circuit 15, and the feedback circuit 16 of the slave stage 100s of FIG. 1A.

In some embodiments, the feedback circuit 26 is configured to be turned off by the clock signals Phase_0 and Phase_1 prior to the transmission circuit 24 being turned on by the clock signals Phase_1 and Phase_2, such that the signals received by the slave stage 200s can be correctly transmitted to the output device 27.

If the feedback circuit 26 is kept on while the transmission circuit 24 is turned on, the signals transmitted by the slave stage 200s to the output device 27 may be adversely affected, and as a result the device 200 may not be able to operate as expected. While transmission circuit 24 is on, the feedback circuit 26 can be expected to be completely turned off so as to not affect the operation of the device 200. This can be achieved by the configuration shown in FIG. 2A, in which the feedback circuit 26 is controlled by signals (e.g., Phase_0 and Phase_1) more advanced in timing than the signals (e.g., Phase_1 and Phase_2) for controlling the transmission circuit 24.

By controlling the feedback circuits 23 and 26 with appropriate clock signals, signal conflicts/jitters between the master stage 200m and the slave stage 200s can be prevented. As a result, compared to other approaches, the device 200 improves Vmin, for around 25 mV to 50 mV. That is, the device 200 can operate properly at lower voltage. The decreased Vmin allows device 200 to be widely used in common semiconductor systems.

Figure 2B:
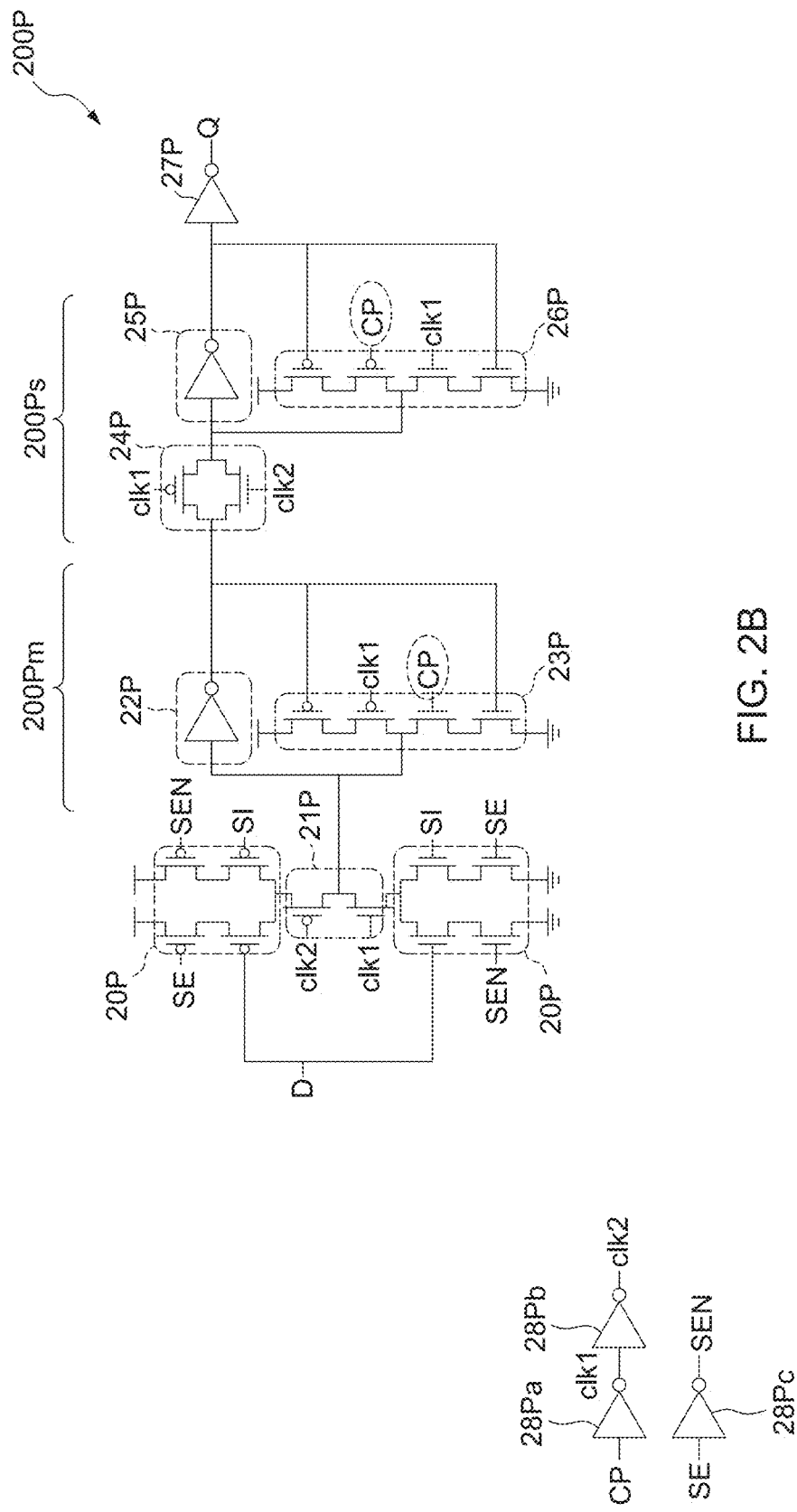
FIG. 2B is a schematic view of a semiconductor device, in accordance with some embodiments of the present disclosure.

FIG. 2B illustrates a schematic view of a semiconductor device, in accordance with some embodiments of the present disclosure.

FIG. 2B shows a device 200P. The device 200P can be an electrical device. The device 200P can be a semiconductor device. The device 200P can be a system of integrated circuits (IC). The device 200P can be a flip-flop. The device 200P can be a rising-edge triggering flip-flop. The device 200P can be an embodiment corresponding to the device 200.

The device 200P includes a multiplexing device 20P, a master stage 200Pm, a slave stage 200Ps, and an output device 27P. The multiplexing device 20P corresponds to multiplexing device 10P discussed above with respect to FIG. 1B. The master stage 200Pm can also be referred to as a latching circuit. The slave stage 200Ps can also be referred to as a latching circuit.

The device 200P may further include phase shift circuits 28Pa, 28Pb and 28Pc. The phase shift circuit 28Pa is configured to receive the clock signal CP and then provide the clock signal clk1. The phase shift circuit 28Pb is configured to receive the clock signal clk1 and then provide the clock signal clk2. A phase-shift quantity exists between the clock signals clk1 and CP. A phase-shift quantity exists between the clock signals clk2 and clk1. In some embodiments, the phase shift circuit 28Pa is an inverter. In some embodiments, the phase shift circuit 28Pb is an inverter.

The phase shift circuit 28Pc is configured to receive the signal SE and then provide the signal SEN. A phase-shift quantity exists between the signals SE and SEN. In some embodiments, the phase shift circuit 28Pc is an inverter. In some embodiments, the signal SEN corresponds to an inversion of the signal SE.

The master stage 200Pm includes a transmission circuit 21P, a phase shift circuit 22P, and a feedback circuit 23P. The transmission circuit 21P is electrically connected to the phase shift circuit 22P and the feedback circuit 23P. The transmission circuit 21P is coupled to the phase shift circuit 22P and the feedback circuit 23P. The output terminal of the phase shift circuit 22P is electrically connected to the input terminals of the feedback circuit 23P. The output terminal of the feedback circuit 23P is electrically connected to the input terminal of the phase shift circuit 22P.

The transmission circuit 21P includes two input terminals configured to receive clock signals clk1 and clk2. The feedback circuit 23P includes two input terminals configured to receive clock signals clk1 and CP. In some embodiments, the feedback circuit 23P is configured to be turned off by the clock signals clk1 and CP prior to the transmission circuit 21P being turned on, such that the signals received by the master stage 200Pm can be correctly transmitted to the slave stage 200Ps.

If the feedback circuit 23P is kept on while the transmission circuit 21P is turned on, the signals transmitted by the master stage 200Pm to the slave stage 200Ps may be adversely affected, and as a result the device 200P may not be able to operate as expected. While transmission circuit 21P is on, the feedback circuit 23P can be expected to be completely turned off so as to not affect the operation of the device 200P.

The slave stage 200Ps includes a transmission circuit 24P, a phase shift circuit 25P, and a feedback circuit 26P. The transmission circuit 24P is electrically connected to the phase shift circuit 25P and the feedback circuit 26P. The output terminal of the phase shift circuit 25P is electrically connected to the input terminals of the feedback circuit 26P. The output terminal of the feedback circuit 26P is electrically connected to the input terminal of the phase shift circuit 25P.

The transmission circuit 24P includes two input terminals configured to receive clock signals clk1 and clk2. The feedback circuit 26P includes two input terminals configured to receive clock signals CP and clk1. In some embodiments, the feedback circuit 26P is configured to be turned off by the clock signals CP and clk1 prior to the transmission circuit 24P being turned on by the clock signals clk1 and clk2, such that the signals received by the slave stage 200Ps can be correctly transmitted to the output device 27P.

If the feedback circuit 26P is kept on while the transmission circuit 24P is turned on, the signals transmitted by the slave stage 200Ps to the output device 27P may be adversely affected, and as a result the device 200P may not be able to operate as expected. While transmission circuit 24P is on, the feedback circuit 26P can be expected to be completely turned off so as to not affect the operation of the device 200P. This can be achieved by the configuration shown in FIG. 2B, in which the feedback circuit 26P is controlled by signals (e.g., CP and clk1) more advanced in timing than the signals (e.g., clk1 and clk2) for controlling the transmission circuit 24P.

By controlling the feedback circuits 23P and 26P with appropriate clock signals, signal conflicts/jitters between the master stage 200Pm and the slave stage 200Ps can be prevented. As a result, compared to other approaches, the device 200P improves Vmin, for around 25 mV to 50 mV. That is, the device 200P can operate properly at lower voltage. The decreased Vmin allows device 200P to be widely used in common semiconductor systems.

Figure 2C:
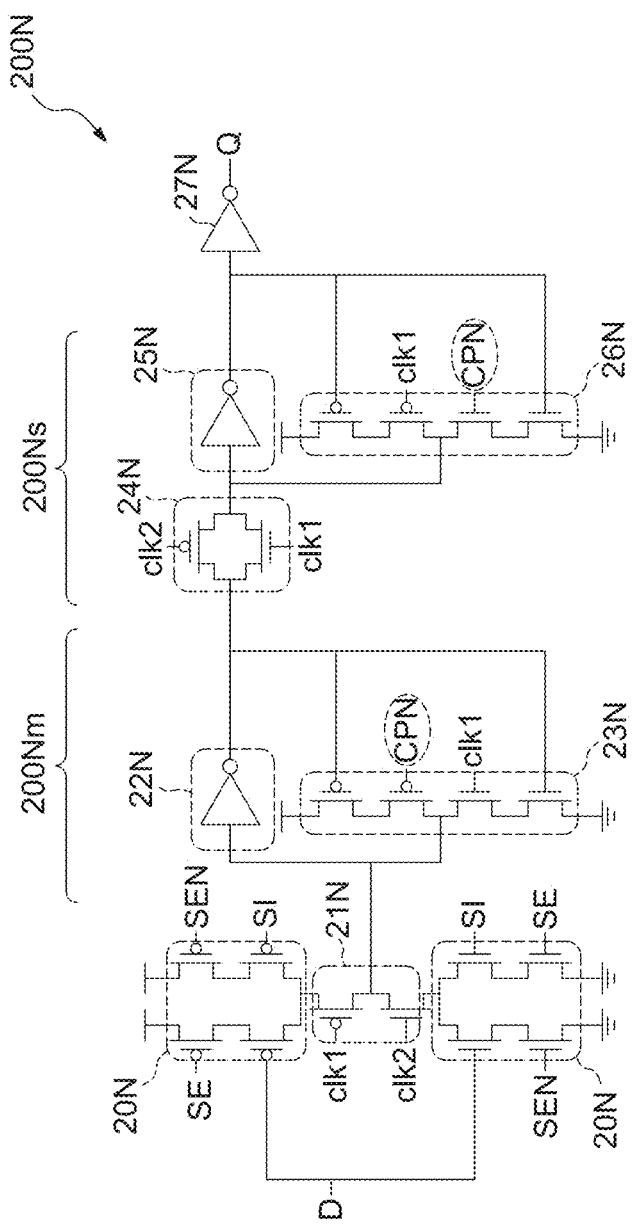
FIG. 2C is a schematic view of a semiconductor device, in accordance with some embodiments of the present disclosure.
Figure 2C:
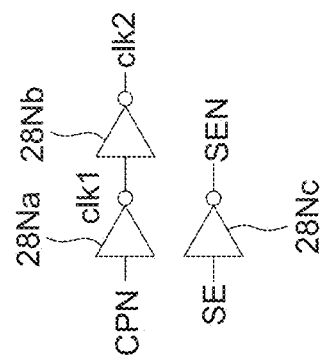

FIG. 2C illustrates a schematic view of a semiconductor device, in accordance with some embodiments of the present disclosure.

FIG. 2C shows a device 200N. The device 200N can be an electrical device. The device 200N can be a semiconductor device. The device 200N can be a system of integrated circuits (IC). The device 200N can be a flip-flop. The device 200N can be a falling-edge triggering flip-flop. The device 200N can be an embodiment corresponding to the device 200.

The device 200N includes a multiplexing device 20N, a master stage 200Nm, a slave stage 200Ns, and an output device 27N. The multiplexing device 20N corresponds to multiplexing device 10P discussed above with respect to FIG. 1B. The master stage 200Nm can also be referred to as a latching circuit. The slave stage 200Ns can also be referred to as a latching circuit.

The device 200N may further include phase shift circuits 28Na, 28Nb and 28Nc. The phase shift circuit 28Na is configured to receive the clock signal CPN and then provide the clock signal clk1. The phase shift circuit 28Nb is configured to receive the clock signal clk1 and then provide the clock signal clk2. A phase-shift quantity exists between the clock signals clk1 and CPN. A phase-shift quantity exists between the clock signals clk2 and clk1. In some embodiments, the phase shift circuit 28Na is an inverter. In some embodiments, the phase shift circuit 28Nb is an inverter.

The clock signal CPN shown in FIG. 2C can correspond to an inversion of the clock signal CP shown in FIG. 2B. A phase-shift quantity may exist between the clock signal CPN shown in FIG. 2C and the clock signal CP shown in FIG. 2B.

The phase shift circuit 28Nc is configured to receive the signal SE and then provide the signal SEN. A phase-shift quantity exists between the signals SE and SEN. In some embodiments, the phase shift circuit 28Nc is an inverter. In some embodiments, the signal SEN corresponds to an inversion of the signal SE.

The master stage 200Nm includes a transmission circuit 21N, a phase shift circuit 22N, and a feedback circuit 23N. The transmission circuit 21N is electrically connected to the phase shift circuit 22N and the feedback circuit 23N. The output terminal of the phase shift circuit 22N is electrically connected to the input terminals of the feedback circuit 23N. The output terminal of the feedback circuit 23N is electrically connected to the input terminal of the phase shift circuit 22N.

The transmission circuit 21N includes two input terminals configured to receive clock signals clk1 and clk2. The feedback circuit 23N includes two input terminals configured to receive clock signals clk1 and CPN. In some embodiments, the feedback circuit 23N is configured to be turned off by the clock signals clk1 and CPN prior to the transmission circuit 21N being turned on, such that the signals received by the master stage 200Nm can be correctly transmitted to the slave stage 200Ns.

If the feedback circuit 23N is kept on while the transmission circuit 21N is turned on, the signals transmitted by the master stage 200Nm to the slave stage 200Ns may be adversely affected, and as a result the device 200N may not be able to operate as expected. While transmission circuit 21N is on, the feedback circuit 23N can be expected to be completely turned off so as to not affect the operation of the device 200N.

The slave stage 200Ns includes a transmission circuit 24N, a phase shift circuit 25N, and a feedback circuit 26N. The transmission circuit 24N is electrically connected to the phase shift circuit 25N and the feedback circuit 26N. The output terminal of the phase shift circuit 25N is electrically connected to the input terminals of the feedback circuit 26N. The output terminal of the feedback circuit 26N is electrically connected to the input terminal of the phase shift circuit 25N.

The transmission circuit 24N includes two input terminals configured to receive clock signals clk1 and clk2. The feedback circuit 26N includes two input terminals configured to receive clock signals CPN and clk1. In some embodiments, the feedback circuit 26N is configured to be turned off by the clock signals CPN and clk1 prior to the transmission circuit 24N being turned on by the clock signals clk1 and clk2, such that the signals received by the slave stage 200Ns can be correctly transmitted to the output device 27N.

If the feedback circuit 26N is kept on while the transmission circuit 24N is turned on, the signals transmitted by the slave stage 200Ns to the output device 27N may be adversely affected, and as a result the device 200N may not be able to operate as expected. While transmission circuit 24N is on, the feedback circuit 26N can be expected to be completely turned off so as to not affect the operation of the device 200N. This can be achieved by the configuration shown in FIG. 2C, in which the feedback circuit 26N is controlled by signals (e.g., CPN and clk1) more advanced in timing than the signals (e.g., clk1 and clk2) for controlling the transmission circuit 24N.

By controlling the feedback circuits 23N and 26N with appropriate clock signals, signal conflicts/jitters between the master stage 200Nm and the slave stage 200Ns can be prevented. As a result, compared to other approaches, the device 200N improves Vmin, for around 25 mV to 50 mV. That is, the device 200N can operate properly at lower voltage. The decreased Vmin allows device 200N to be widely used in common semiconductor systems.

Figure 3A:
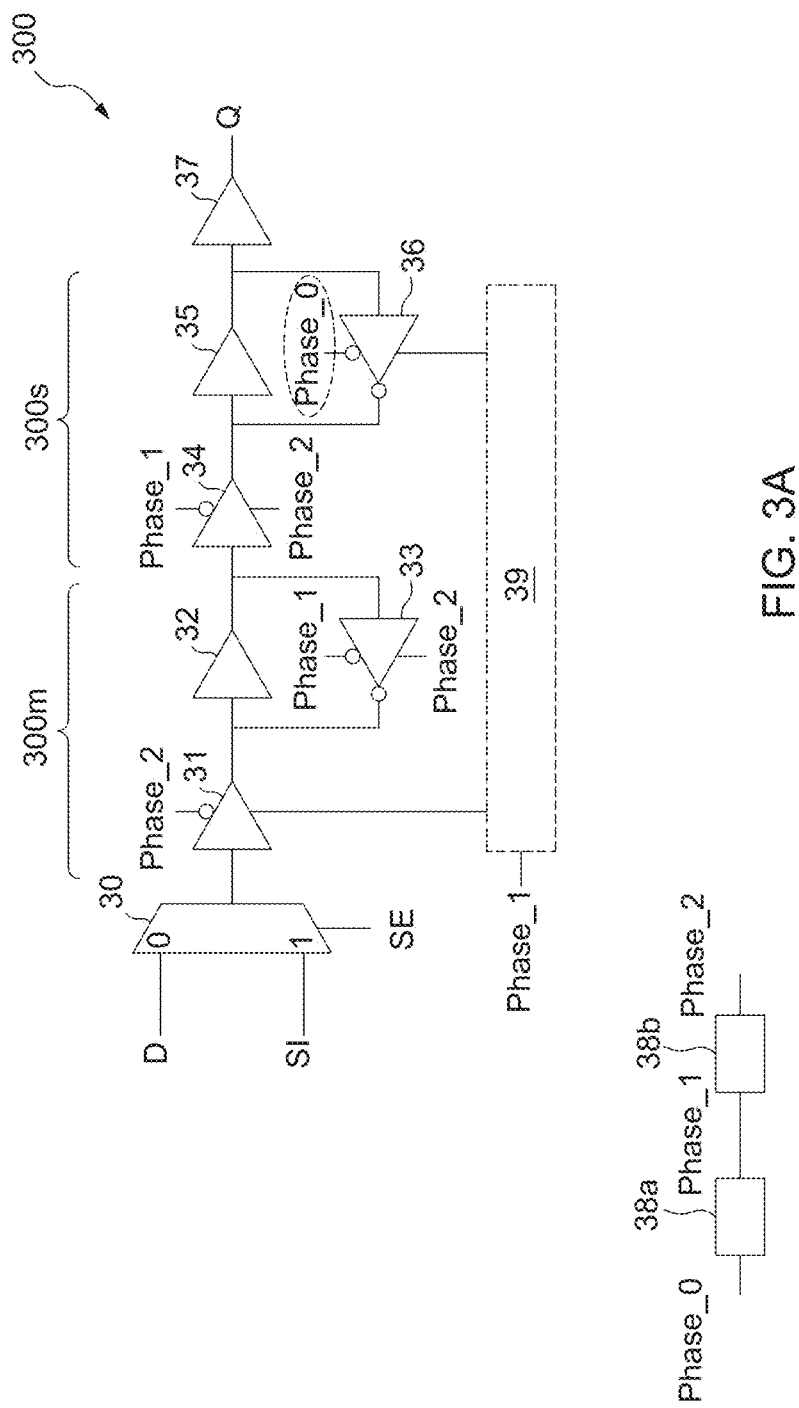
FIG. 3A is a schematic view of a semiconductor device, in accordance with some embodiments of the present disclosure.

FIG. 3A illustrates a schematic view of a semiconductor device, in accordance with some embodiments of the present disclosure.

FIG. 3A shows a device 300. The device 300 can be an electrical device. The device 300 can be a semiconductor device. The device 300 can be a system of integrated circuits (IC). The device 300 can be a flip-flop. The device 300 includes a multiplexing device 30, a master stage 300*m*, a slave stage 300*s*, and an output device 37. The multiplexing device 30 includes input terminals for receiving signals SE, SI and D. The master stage 300*m* can also be referred to as a latching circuit. The slave stage 300*s* can also be referred to as a latching circuit.

The functions of the multiplexing device 30 are similar to those of the multiplexing devices 10 and 20, and thus the details are not repeated here.

The master stage 300*m* includes a transmission circuit 31, a phase shift circuit 32, and a feedback circuit 33. The slave stage 300*s* includes a transmission circuit 34, a phase shift circuit 35, and a feedback circuit 36.

The transmission circuit 31, the phase shift circuit 32, and the feedback circuit 33 of the master stage 300m are configured similar to the transmission circuit 11, the phase shift circuit 12, and the feedback circuit 13 of the master stage 100m. The transmission circuit 34, the phase shift circuit 35, and the feedback circuit 36 of the slave stage 300s are configured similar to the transmission circuit 14, the phase shift circuit 15, and the feedback circuit 16 of the slave stage 100s.

The device 300 shown in FIG. 3A is similar to the device 100 shown in FIG. 1A, except that the device 300 includes a clocked device 39 shared by the master stage 300m and the slave stage 300s. With the clocked device 39 shared by the master stage 300m and the slave stage 300s, the total number of clocked devices within the device 300 can be reduced. The clocked device mentioned in the present disclosure can refer to a device that receives clock signals. The clocked device mentioned in the present disclosure can refer to a device that is triggered by clock signals. A clocked device can regularly dissipate power while the operation of a flip-flop device. Therefore, reducing the total number of clocked devices within a flip-flop device can facilitate lowering the power consumption of the flip-flop device.

In some embodiments, the feedback circuit 33 is configured to be turned off by the clock signals Phase_1 and Phase_2 prior to the transmission circuit 31 being turned on by the clock signals Phase_1 and Phase_2, such that the signals received by the master stage 300m can be correctly transmitted to the slave stage 300s. In some embodiments, the feedback circuit 36 is configured to be turned off by the clock signals Phase_0 and Phase_1 prior to the transmission circuit 34 being turned on by the clock signals Phase_1 and Phase_2, such that the signals received by the slave stage 300s can be correctly transmitted to the output device 37.

If the feedback circuit 36 is kept on while the transmission circuit 34 is turned on, the signals transmitted by the slave stage 300s to the output device 37 may be adversely affected, and as a result the device 300 may not be able to operate as expected. While transmission circuit 34 is on, the feedback circuit 36 can be expected to be completely turned off so as to not affect the operation of the device 300. This can be achieved by the configuration shown in FIG. 3A, in which the feedback circuit 36 controlled by signals (e.g., Phase_0 and Phase_1) more advanced in timing than the signals (e.g., Phase_1 and Phase_2) for controlling the transmission circuit 34.

The device 300 may further include phase shift circuits 38a and 38b. The functions of the phase shift circuits 38a and 38b are similar to those of the phase shift circuits 18a and 18b, and thus the details are not repeated here.

The transmission circuit 31 of the master stage 300m and the transmission circuit 34 of the slave stage 300s can be controlled by identical clock signals (e.g., Phase_1 and Phase_2). The feedback circuit 33 of the master stage 300m and the feedback circuit 36 of the slave stage 300s can be controlled by different clock signals. By controlling the feedback circuit 36 with appropriate clock signals, signal conflicts/jitters between the master stage 300m and the slave stage 300s can be prevented. As a result, compared to other approaches, the device 300 improves Vmin, for around 25 mV to 50 mV. The decreased Vmin allows device 300 to be widely used in common semiconductor systems.

Figure 3B:
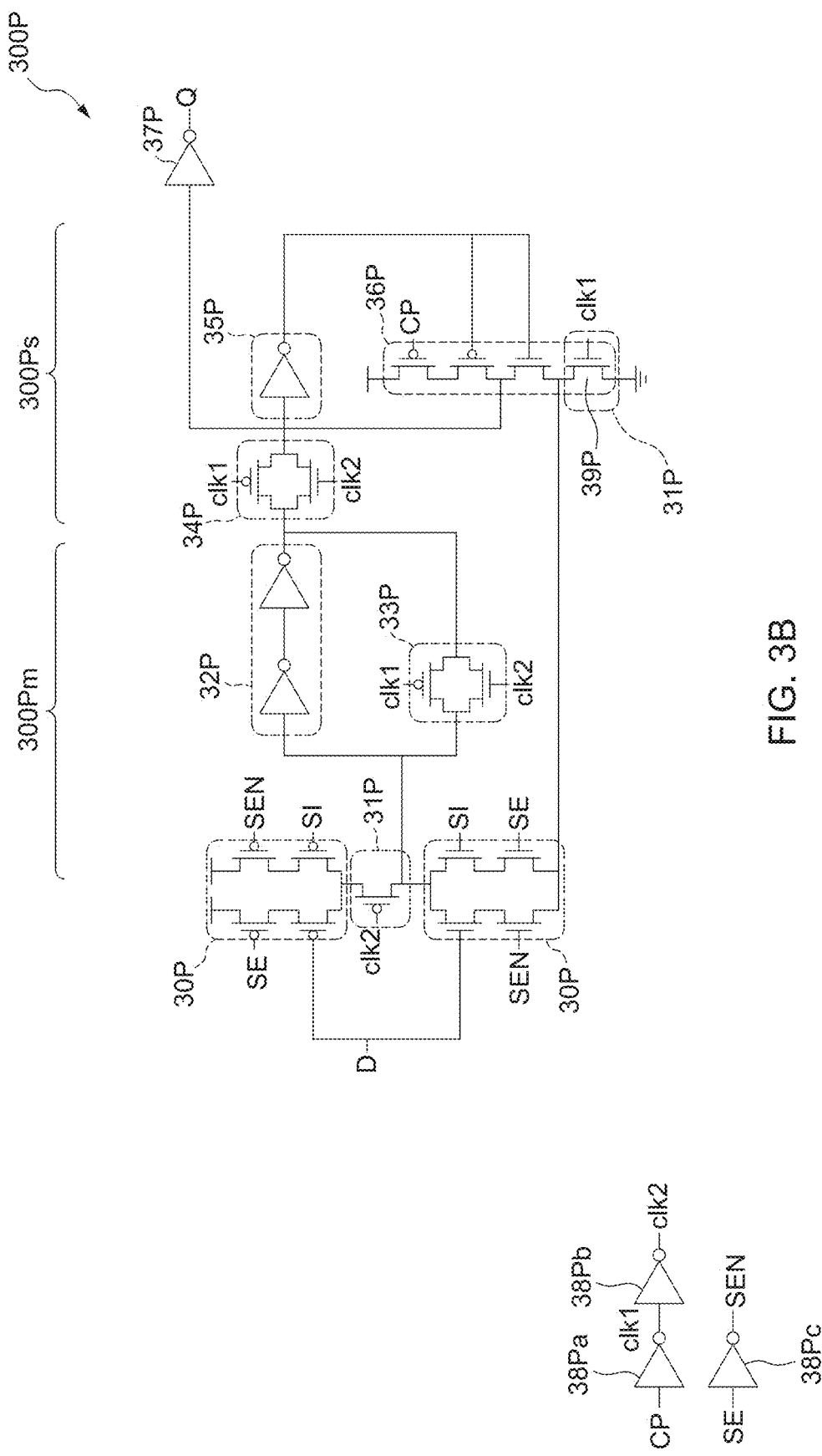
FIG. 3B is a schematic view of a semiconductor device, in accordance with some embodiments of the present disclosure.

FIG. 3B illustrates a schematic view of a semiconductor device, in accordance with some embodiments of the present disclosure.

FIG. 3B shows a device 300P. The device 300P can be an electrical device. The device 300P can be a semiconductor device. The device 300P can be a system of integrated circuits (IC). The device 300P can be a flip-flop. The device 300P can be a rising-edge triggering flip-flop. The device 300P can be an embodiment corresponding to the device 300.

The device 300P includes a multiplexing device 30P, a master stage 300Pm, a slave stage 300Ps, and an output device 37P. The multiplexing device 30P includes input terminals for receiving signals SE, SEN, SI and D. The master stage 300Pm can also be referred to as a latching circuit. The slave stage 300Ps can also be referred to as a latching circuit.

The functions of the multiplexing device 30P are similar to those of the multiplexing devices 10P and 20P, and thus the details are not repeated here.

The device 300P may further include phase shift circuits 38Pa, 38Pb and 38Pc. The functions of the phase shift circuits 38Pa, 38Pb and 38Pc are similar to those of the phase shift circuits 18Pa, 18Pb and 18Pc, and thus the details are not repeated here.

The master stage 300Pm includes a transmission circuit 31P, a phase shift circuit 32P, and a feedback circuit 33P. The transmission circuit 31P is electrically connected to the phase shift circuit 32P and the feedback circuit 33P. The output terminal of the phase shift circuit 32P is electrically connected to the input terminal of the feedback circuit 33P. The output terminal of the feedback circuit 33P is electrically connected to the input terminal of the phase shift circuit 32P.

In some embodiments, the phase shift circuit 32P includes two series-connected inverters. Compared to the phase shift circuit 12P shown in FIG. 1B or the phase shift circuit 22P shown in FIG. 2B, it can be found that the phase shift circuit 32P includes an additional inverter, facilitating reduction of current leakage from the device 300P. In some embodiments, the feedback circuit 33P includes a transmission gate that is configured to receive clock signals clk1 and clk2.

The transmission circuit 31P includes two input terminals configured to receive clock signals clk1 and clk2. Referring to FIG. 3B, the transmission circuit 31P includes two transistors, one located at the master stage 300Pm and configured to receive the clock signal clk2, and the other (i.e., the clocked device 39P) at the slave stage 300Ps and configured to receive the clock signal clk1.

The clocked device 39P can be a portion of the transmission circuit 31P, and also a portion of the feedback circuit 36P. The clocked device 39P can be shared by the transmission circuit 31P and the feedback circuit 36P. The clocked device 39P can be shared by the master stage 300Pm and the slave stage 300Ps.

The feedback circuit 33P includes two input terminals configured to receive clock signals clk1 and clk2.

In some embodiments, the feedback circuit 33P is configured to be turned off by the clock signals clk1 and clk2 prior to the transmission circuit 31P being turned on, such that the signals received by the master stage 300Pm can be correctly transmitted to the slave stage 300Ps.

The slave stage 300Ps includes a transmission circuit 34P, a phase shift circuit 35P, and a feedback circuit 36P. The transmission circuit 34P is electrically connected to the phase shift circuit 35P and the feedback circuit 36P. The output terminal of the phase shift circuit 35P is electrically connected to the input terminals of the feedback circuit 36P. The output terminal of the feedback circuit 36P is electrically connected to the input terminal of the phase shift circuit 35P.

The transmission circuit 34P includes two input terminals configured to receive clock signals clk1 and clk2. The feedback circuit 36P includes two input terminals configured to receive clock signals CP and clk1. The clocked device 39P corresponds to the transistor of the feedback circuit 36P that is configured to receive the clock signal clk1. The clocked device 39P can be shared by the transmission circuit 31P and the feedback circuit 36P.

In some embodiments, the feedback circuit 36P is configured to be turned off by the clock signals CP and clk1 prior to the transmission circuit 34P being turned on by the clock signals clk1 and clk2, such that the signals received by the slave stage 300Ps can be correctly transmitted to the output device 37P.

If the feedback circuit 36P is kept on while the transmission circuit 34P is turned on, the signals transmitted by the slave stage 300Ps to the output device 37P may be adversely affected, and as a result the device 300P may not be able to operate as expected. While transmission circuit 34P is on, the feedback circuit 36P can be expected to be completely turned off so as to not affect the operation of the device 300P. This can be achieved by the configuration shown in FIG. 3B, in which the feedback circuit 36P is controlled by signals (e.g., CP and clk1) more advanced in timing than the signals (e.g., clk1 and clk2) for controlling the transmission circuit 34P.

By controlling the feedback circuit 36P with appropriate clock signals, signal conflicts/jitters between the master stage 300Pm and the slave stage 300Ps can be prevented. As a result, the device 300P improves Vmin, for around 25 mV to 50 mV. The decreased Vmin allows device 300P to be widely used in common semiconductor systems.

Further, the benefits of the device 300P include shorter circuit propagation delays (for example, clock-to-Q delay) compared to other approaches. Referring to FIG. 3B, the clock signal CP needs only to pass through the phase shift circuits 38Pa and 38Pb, the transmission circuit 34P, and the output device 37P before the device 300P can provide the output signal Q.

Figure 3C:
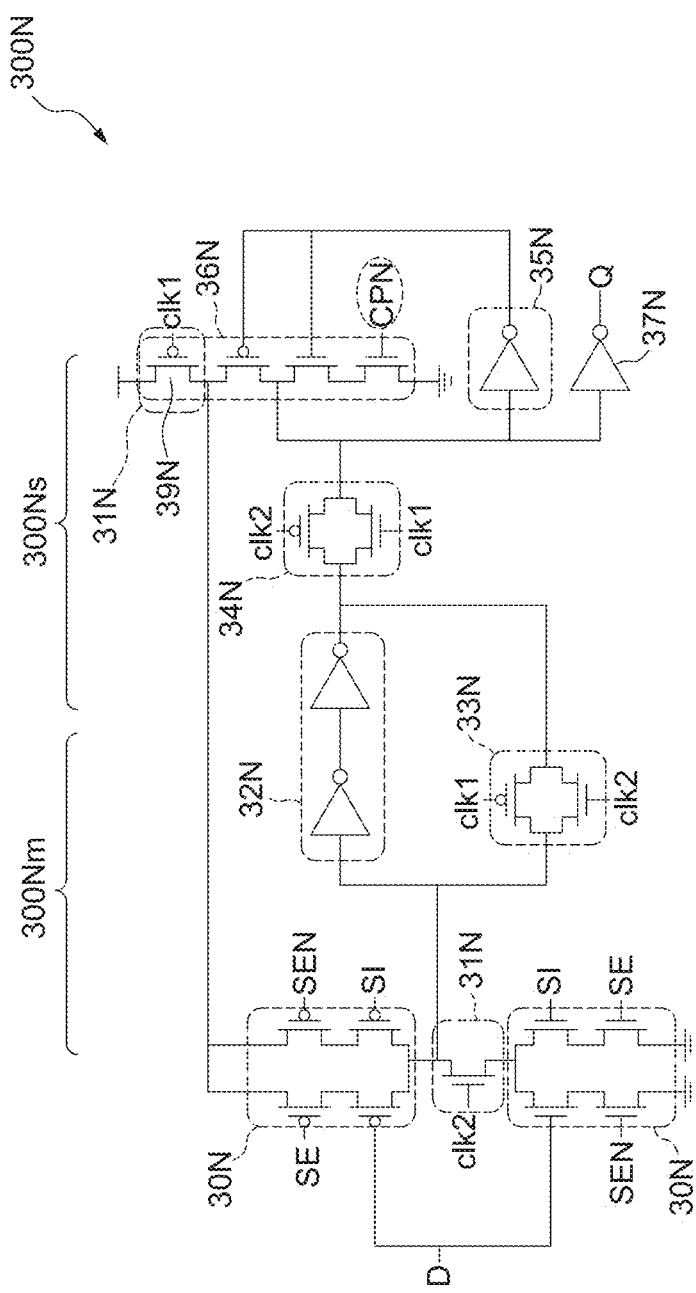
FIG. 3C is a schematic view of a semiconductor device, in accordance with some embodiments of the present disclosure.
Figure 3C:
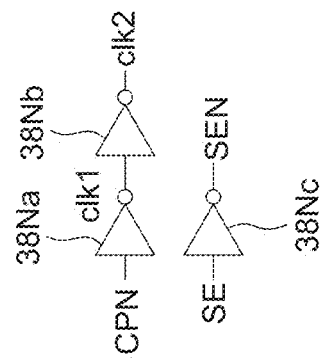

FIG. 3C illustrates a schematic view of a semiconductor device, in accordance with some embodiments of the present disclosure.

FIG. 3C shows a device 300N. The device 300N can be an electrical device. The device 300N can be a semiconductor device. The device 300N can be a system of integrated circuits (IC). The device 300N can be a flip-flop. The device 300N can be a falling-edge triggering flip-flop. The device 300N can be an embodiment corresponding to the device 300.

The device 300N includes a multiplexing device 30N, a master stage 300Nm, a slave stage 300Ns, and an output device 37N. The multiplexing device 30N includes input terminals for receiving signals SE, SEN, SI and D. The master stage 300Nm can also be referred to as a latching circuit. The slave stage 300Ns can also be referred to as a latching circuit.

The functions of the multiplexing device 30N are similar to those of the multiplexing devices 10N and 20N, and thus the details are not repeated here.

The device 300N may further include phase shift circuits 38Na, 38Nb and 38Nc. The functions of the phase shift circuits 38Na, 38Nb and 38Nc are similar to those of the phase shift circuits 18Na, 18Nb and 18Nc, and thus the details are not repeated here.

The master stage 300Nm includes a transmission circuit 31N, a phase shift circuit 32N, and a feedback circuit 33N. The transmission circuit 31N is electrically connected to the phase shift circuit 32N and the feedback circuit 33N. The output terminal of the phase shift circuit 32N is electrically connected to the input terminal of the feedback circuit 33N. The output terminal of the feedback circuit 33N is electrically connected to the input terminal of the phase shift circuit 32N.

In some embodiments, the phase shift circuit 32N includes two series-connected inverters. Compared to the phase shift circuit 12N shown in FIG. 1C or the phase shift circuit 22N shown in FIG. 2C, it can be found that the phase shift circuit 32N includes an additional inverter. The additional inverter of the phase shift circuit 32N can facilitate reduction of current leakage for the device 300N. In some embodiments, the feedback circuit 33N includes a transmission gate that is configured to receive clock signals clk1 and clk2.

The transmission circuit 31N includes two input terminals configured to receive clock signals clk1 and clk2. Referring to FIG. 3C, the transmission circuit 31N includes two transistors, one at the master stage 300Nm and configured to receive the clock signal clk2, and the other (i.e., the clocked device 39N) at the slave stage 300Ns and configured to receive the clock signal clk1.

The clocked device 39N can be a portion of the transmission circuit 31N, and also a portion of the feedback circuit 36N. The clocked device 39N can be shared by the transmission circuit 31N and the feedback circuit 36N. The clocked device 39N can be shared by the master stage 300Nm and the slave stage 300Ns.

The feedback circuit 33N includes two input terminals configured to receive clock signals clk1 and clk2.

In some embodiments, the feedback circuit 33N is configured to be turned off by the clock signals clk1 and clk2 prior to the transmission circuit 31N being turned on, such that the signals received by the master stage 300Nm can be correctly transmitted to the slave stage 300Ns.

The slave stage 300Ns includes a transmission circuit 34N, a phase shift circuit 35N, and a feedback circuit 36N. The transmission circuit 34N is electrically connected to the phase shift circuit 35N and the feedback circuit 36N. The output terminal of the phase shift circuit 35N is electrically connected to the input terminals of the feedback circuit 36N. The output terminal of the feedback circuit 36N is electrically connected to the input terminal of the phase shift circuit 35N.

The transmission circuit 34N includes two input terminals configured to receive clock signals clk1 and clk2. The feedback circuit 36N includes two input terminals configured to receive clock signals CPN and clk1. The clocked device 39N corresponds to the transistor of the feedback circuit 36N that is configured to receive the clock signal clk1. The clocked device 39N can be shared by the transmission circuit 31N and the feedback circuit 36N.

In some embodiments, the feedback circuit 36N is configured to be turned off by the clock signals CPN and clk1 prior to the transmission circuit 34N being turned on by the clock signals clk1 and clk2, such that the signals received by the slave stage 300Ns can be correctly transmitted to the output device 37N.

If the feedback circuit 36N is kept on while the transmission circuit 34N is turned on, the signals transmitted by the slave stage 300Ns to the output device 37N may be adversely affected, and as a result the device 300N may not be able to operate as expected. While transmission circuit 34N is on, the feedback circuit 36N can be expected to be completely turned off so as to not affect the operation of the device 300N. This can be achieved by the configuration shown in FIG. 3C, in which the feedback circuit 36N is controlled by signals (e.g., CPN and clk1) more advanced in timing than the signals (e.g., clk1 and clk2) for controlling the transmission circuit 34N.

By controlling the feedback circuit 36N with appropriate clock signals, signal conflicts/jitters between the master stage 300Nm and the slave stage 300Ns can be prevented. As a result, compared to other approaches, the device 300N improves Vmin, for around 25 mV to 50 mV. The decreased Vmin allows device 300N to be widely used in common semiconductor systems.

Further, the benefits of the device 300N include shorter circuit propagation delays (for example, clock-to-Q delay) compared to other approaches. Referring to FIG. 3C, the clock signal CPN needs only to pass through the phase shift circuits 38Na and 38Nb, the transmission circuit 34N, and the output device 37N before the device 300N can provide the output signal Q.

Figure 4A:
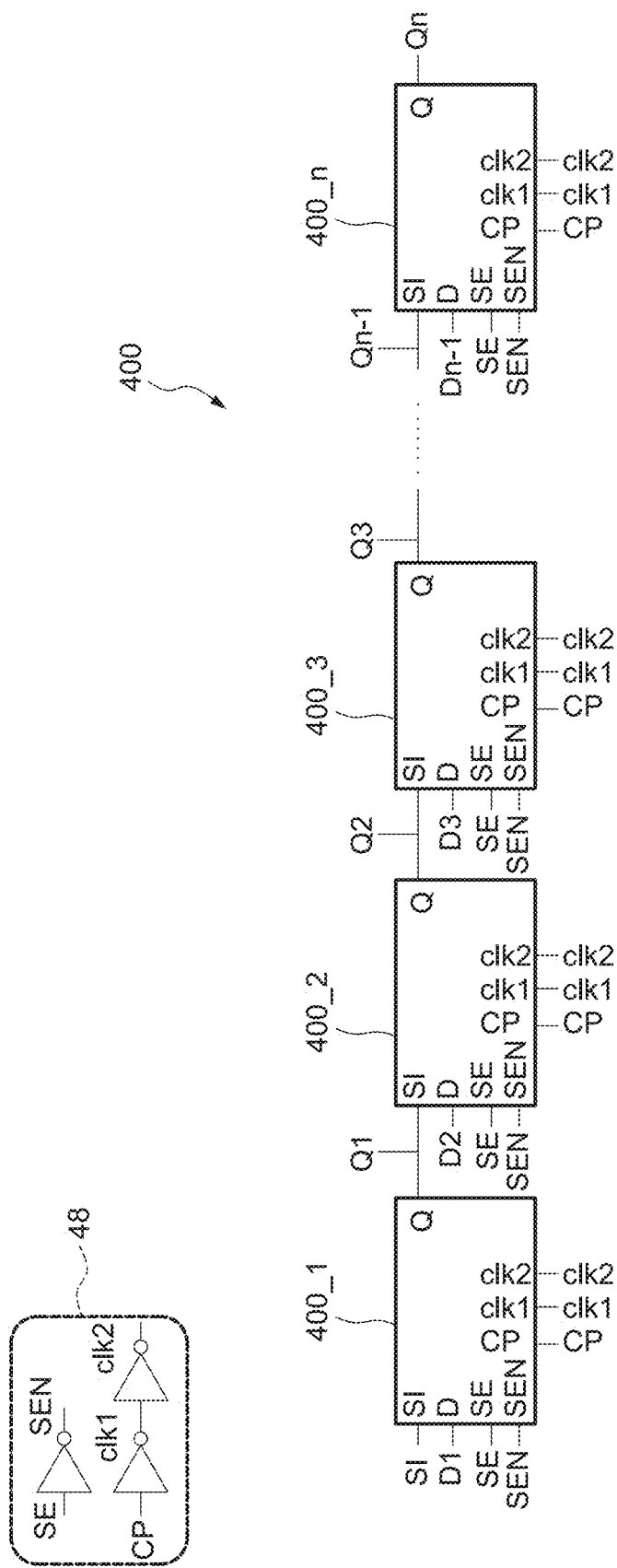
FIG. 4A is a schematic view of a semiconductor device, in accordance with some embodiments of the present disclosure.

FIG. 4A illustrates a schematic view of a semiconductor device, in accordance with some embodiments of the present disclosure. FIG. 4A shows a device 400. The device 400 can be an electrical device. The device 400 can be a semiconductor device. The device 400 can be a system of integrated circuits (IC). The device 400 can be a logical system. The device 400 can be a multi-bit flip-flop. The device 400 can be a rising-edge triggering flip-flop.

The device 400 includes devices 400_1, 400_2, 400_3, . . . , and 400_n. The devices 400_1, 400_2, 400_3, . . . , and 400_n can be connected in series. Each of the devices 400_1, 400_2, 400_3, . . . , and 400_n can be a flip-flop device. Each of the devices 400_1, 400_2, 400_3, . . . , and 400_n can be a single-bit flip-flop. The device 400 can be a multi-bit flip-flop. The device 400 can be a n-bit flip-flop.

The device 400_1 includes input terminals for receiving signals SI, D1, SE, and SEN. The device 400_1 includes input terminals for receiving clock signals CP, clk1, and clk2. The device 400_1 includes an output terminal for providing an output signal Q1. The output signal Q1 can be received by the device 400_2.

The device 400_2 includes input terminals for receiving signals Q1, D2, SE, and SEN. The device 400_2 includes input terminals for receiving clock signals CP, clk1, and clk2. The device 400_2 includes an output terminal for providing an output signal Q2. The output signal Q2 can be received by the device 400_3.

The device 400_3 includes input terminals for receiving signals Q2, D3, SE, and SEN. The device 400_3 includes input terminals for receiving clock signals CP, clk1, and clk2. The device 400_3 includes an output terminal for providing an output signal Q3. The output signal Q3 can be received by a device at the subsequent stage.

The device 400_n includes input terminals for receiving signals Qn-1, Dn-1, SE, and SEN. The device 400_n includes input terminals for receiving clock signals CP, clk1, and clk2. The device 400_n includes an output terminal for providing an output signal Qn.

The device 400 further includes a set of phase shift circuits 48. The set of phase shift circuits 48 can be configured to provide the signal SEN based on the signal SE. The set of phase shift circuits 48 can be configured to provide the clock signals clk1 and clk2 based on the clock signal CP.

Each of the devices 400_1, 400_2, 400_3, . . . , and 400_n can be implemented by the device 100P shown in FIG. 1B, the device 200P shown in FIG. 2B, or the device 300P shown in FIG. 3B. In some embodiments, each of the devices 400_1, 400_2, 400_3, . . . , and 400_n has an identical internal structure. In some embodiments, each of the devices 400_1, 400_2, 400_3, . . . , and 400_n is implemented solely by the device 100P, solely by the device 200P, or solely by the device 300P. In some embodiments, the devices 400_1, 400_2, 400_3, . . . , and 400_n have different internal structures. In some embodiments, the devices 400_1, 400_2, 400_3, . . . , and 400_n are implemented by combinations of the devices 100P, 200P, or 300P.

Figure 4B:
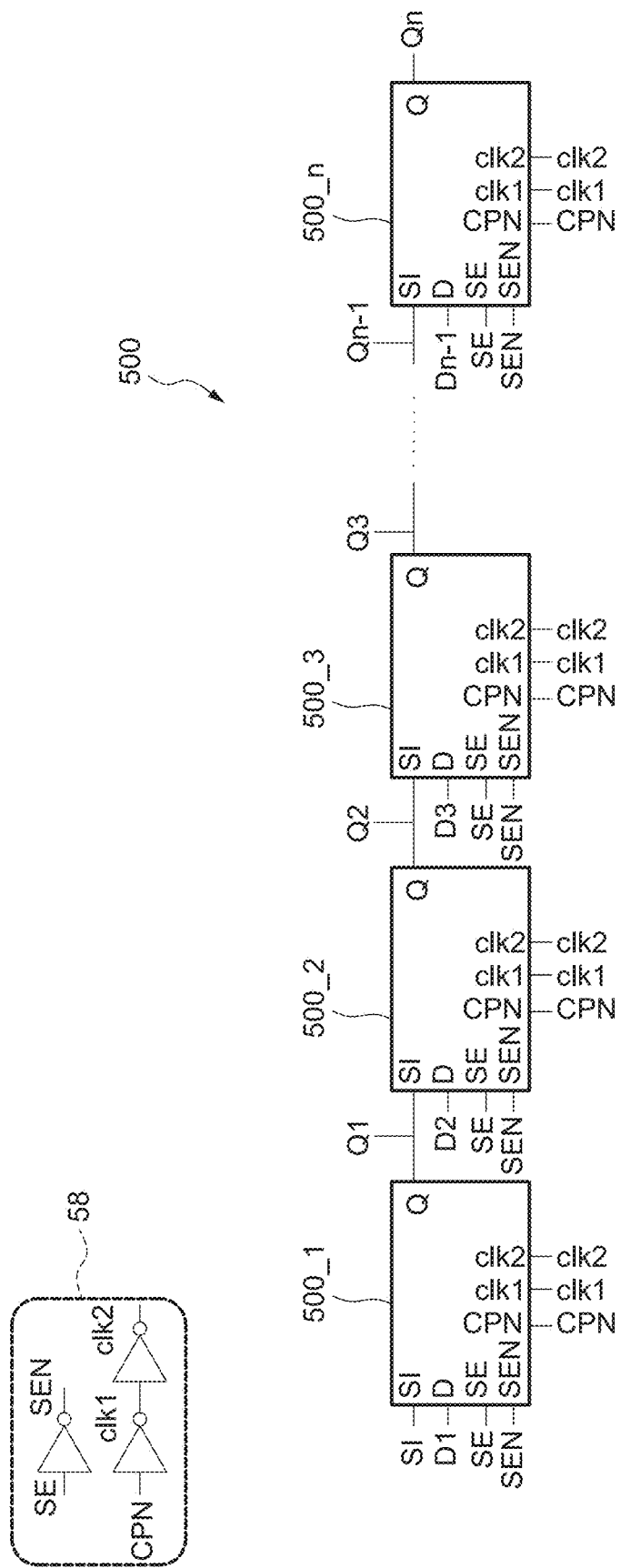
FIG. 4B is a schematic view of a semiconductor device, in accordance with some embodiments of the present disclosure.

FIG. 4B illustrates a schematic view of a semiconductor device, in accordance with some embodiments of the present disclosure. FIG. 4B shows a device 500. The device 500 can be an electrical device. The device 500 can be a semiconductor device. The device 500 can be a system of integrated circuits (IC). The device 500 can be a logical system. The device 500 can be a multi-bit flip-flop. The device 500 can be a falling-edge triggering flip-flop.

The device 500 includes devices 500_1, 500_2, 500_3, . . . , and 500_n. The devices 500_1, 500_2, 500_3, . . . , and 500_n can be connected in series. Each of the devices 500_1, 500_2, 500_3, . . . , and 500_n can be a flip-flop device. Each of the devices 500_1, 500_2, 500_3, . . . , and 500_n can be a single-bit flip-flop. The device 500 can be a multi-bit flip-flop. The device 500 can be a n-bit flip-flop.

The device 500_1 includes input terminals for receiving signals SI, D1, SE, and SEN. The device 500_1 includes input terminals for receiving clock signals CPN, clk1, and clk2. The device 500_1 includes an output terminal for providing an output signal Q1. The output signal Q1 can be received by the device 500_2.

The device 500_2 includes input terminals for receiving signals Q1, D2, SE, and SEN. The device 500_2 includes input terminals for receiving clock signals CPN, clk1, and clk2. The device 500_2 includes an output terminal for providing an output signal Q2. The output signal Q2 can be received by the device 500_3.

The device 500_3 includes input terminals for receiving signals Q2, D3, SE, and SEN. The device 500_3 includes input terminals for receiving clock signals CPN, clk1, and clk2. The device 500_3 includes an output terminal for providing an output signal Q3. The output signal Q3 can be received by a device at the subsequent stage.

The device 500_n includes input terminals for receiving signals Qn-1, Dn-1, SE, and SEN. The device 500_n includes input terminals for receiving clock signals CPN, clk1, and clk2. The device 500_n includes an output terminal for providing an output signal Qn.

The device 500 further includes a set of phase shift circuits 58. The set of phase shift circuits 58 can be configured to provide the signal SEN based on the signal SE. The set of phase shift circuits 58 can be configured to provide the clock signals clk1 and clk2 based on the clock signal CPN.

Each of the devices 500_1, 500_2, 500_3, . . . , and 500_n can be implemented by the device 100N shown in FIG. 1C, the device 200N shown in FIG. 2C, or the device 300N shown in FIG. 3C. In some embodiments, each of the devices 500_1, 500_2, 500_3, . . . , and 500_n has an identical internal structure. In some embodiments, each of the devices 500_1, 500_2, 500_3, . . . , and 500_n is implemented solely by the device 100N, solely by the device 200N, or solely by the device 300N. In some embodiments, the devices 500_1, 500_2, 500_3, . . . , and 500_n have different internal structures. In some embodiments, the devices 500_1, 500_2, 500_3, . . . , and 500_n are implemented by combinations of the devices 100N, 200N, or 300N.

Figure 5:
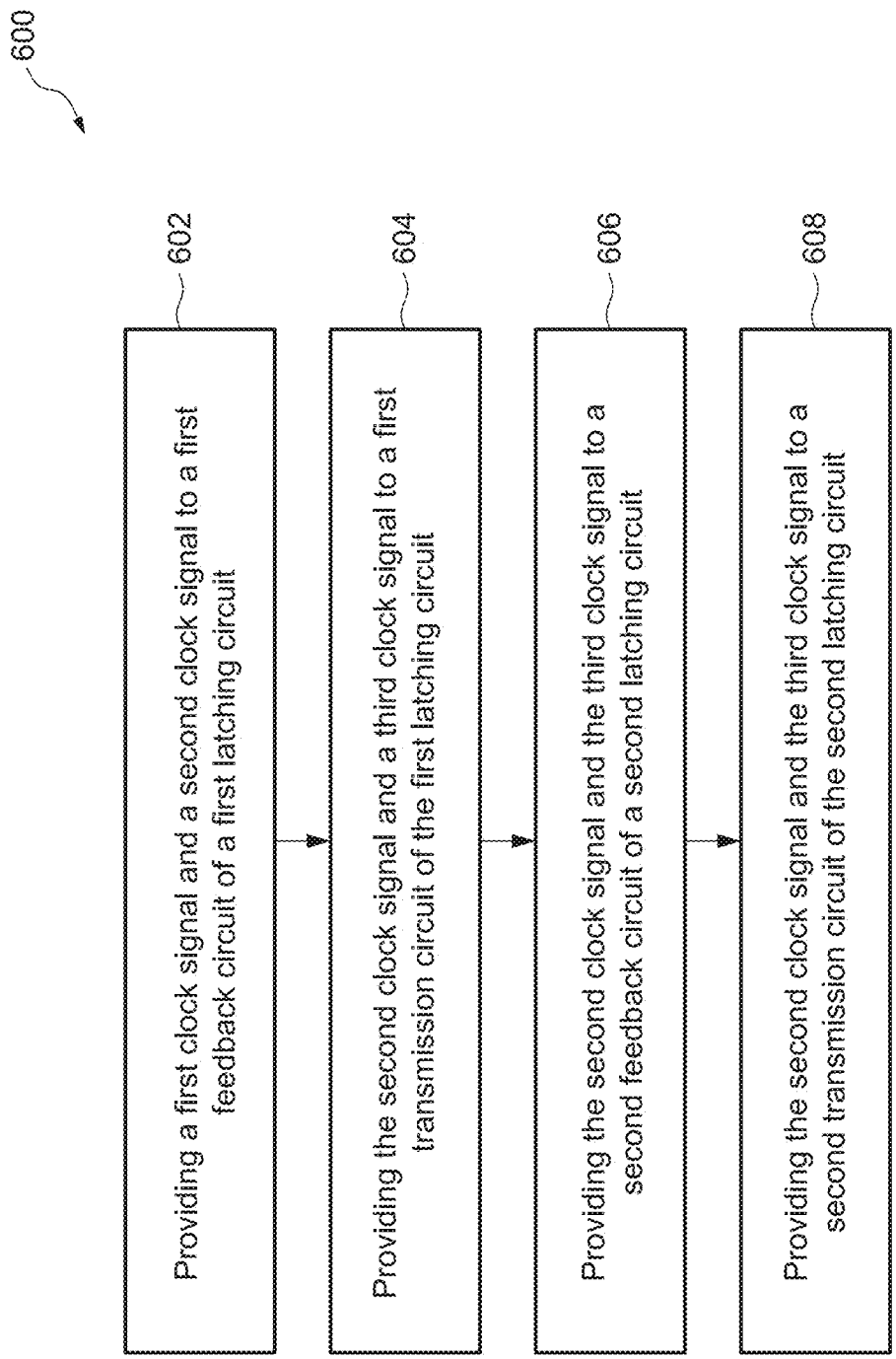
FIG. 5 is a flowchart including operations for operating a semiconductor device, in accordance with some embodiments of the present disclosure.

FIG. 5 illustrates a flow chart including operations of a method 600 of operating a semiconductor device, in accordance with some embodiments of the present disclosure.

FIG. 5 includes operations 602, 604, 606 and 608 of operating a semiconductor device. In the operation 602, a first clock signal and a second clock signal are provided to a first feedback circuit of a first latching circuit. In some embodiments, the operation 602 is carried out on the device 100 of FIG. 1A, the device 100P of FIG. 1B, the device 100N of FIG. 1C, the device 300 of FIG. 3A, the device 300P of FIG. 3B, or the device 300N of FIG. 3C. Using the device 100 as an illustrative example, the clock signals Phase_0 and Phase_1 can be provided to the feedback circuit 16 of the slave stage 100s.

In the operation 604, the second clock signal and a third clock signal are provided to a first transmission circuit of the first latching circuit. In some embodiments, the operation 604 is carried out on the device 100 of FIG. 1A, the device 100P of FIG. 1B, the device 100N of FIG. 1C, the device 300 of FIG. 3A, the device 300P of FIG. 3B, or the device 300N of FIG. 3C. Using the device 100 as an illustrative example, the clock signals Phase_1 and Phase_2 can be provided to the transmission circuit 14 of the slave stage 100s.

In the operation 606, the second clock signal and the third clock signal are provided to a second feedback circuit of a second latching circuit. In some embodiments, the operation 606 is carried out on the device 100 of FIG. 1A, the device 100P of FIG. 1B, the device 100N of FIG. 1C, the device 300 of FIG. 3A, the device 300P of FIG. 3B, or the device 300N of FIG. 3C. Using the device 100 as an illustrative example, the clock signals Phase_1 and Phase_2 can be provided to the feedback circuit 13 of the master stage 100m.

In the operation 608, the second clock signal and the third clock signal are provided to a second transmission circuit of the second latching circuit. In some embodiments, the operation 608 is carried out on the device 100 of FIG. 1A, the device 100P of FIG. 1B, the device 100N of FIG. 1C, the device 300 of FIG. 3A, the device 300P of FIG. 3B, or the device 300N of FIG. 3C. Using the device 100 as an illustrative example, the clock signals Phase_1 and Phase_2 can be provided to the transmission circuit 11 of the master stage 100m.

In some embodiments, a flip-flop circuit includes a first inverter configured to receive a first clock signal and output a second clock signal, a second inverter configured to receive the second clock signal and output a third clock signal, a master latch including a transmission circuit, and a slave latch including a first feedback inverter, wherein the first feedback inverter includes a first transistor configured to receive the first clock signal and a second transistor configured to receive the second clock signal, and the transmission circuit includes a third transistor configured to receive the third clock signal. In some embodiments, each of the first and third transistors includes a first one of a p-type transistor or an n-type transistor, and the second transistor includes a second one of the p-type transistor or the n-type transistor. In some embodiments, the transmission circuit includes a fourth transistor configured to receive the second clock signal, and the fourth transistor includes the second one of the p-type transistor or the n-type transistor. In some embodiments, the slave latch includes a transmission gate, the transmission gate includes a fourth transistor configured to receive the second clock signal and a fifth transistor configured to receive the third clock signal, the fourth transistor includes the first one of the p-type transistor or the n-type transistor, and the fifth transistor includes the second one of the p-type transistor or the n-type transistor. In some embodiments, the master latch includes a second feedback inverter, the second feedback inverter includes a fourth transistor configured to receive the second clock signal, and the fourth transistor includes the first one of the p-type transistor or the n-type transistor. In some embodiments, the second feedback inverter includes a fifth transistor configured to receive the third clock signal, and the fifth transistor includes the second one of the p-type transistor or the n-type transistor. In some embodiments, the second feedback inverter includes a fifth transistor configured to receive the first clock signal, and the fifth transistor includes the second one of the p-type transistor or the n-type transistor. In some embodiments, the first feedback inverter includes fourth and fifth transistors coupled between the first and second transistors, and the transmission circuit includes the second transistor. In some embodiments, the master latch includes third and fourth inverters coupled in series and a transmission gate coupled in parallel with the third and fourth inverters, wherein the transmission gate includes a sixth transistor including a p-type transistor configured to receive the second clock signal and a seventh transistor including an n-type transistor configured to receive the third clock signal.

In some embodiments, a multi-bit data storage circuit includes a first inverter configured to receive a first clock signal and output a second clock signal, a second inverter configured to receive the second clock signal and output a third clock signal, and a series connection of flip-flop circuits, wherein each flip-flop circuit of the series connection includes a master latch including a transmission circuit and a slave latch including a first feedback inverter, the first feedback inverter includes a first transistor configured to receive the first clock signal and a second transistor configured to receive the second clock signal, and the transmission circuit includes a third transistor configured to receive the third clock signal. In some embodiments, each of the first and third transistors includes a first one of a p-type transistor or an n-type transistor, and the second transistor includes a second one of the p-type transistor or the n-type transistor. In some embodiments, the transmission circuit includes a fourth transistor configured to receive the second clock signal, and the fourth transistor includes the second one of the p-type transistor or the n-type transistor. In some embodiments, the slave latch includes a transmission gate, the transmission gate includes a fifth transistor configured to receive the second clock signal and a sixth transistor configured to receive the third clock signal, the fifth transistor includes the first one of the p-type transistor or the n-type transistor, and the sixth transistor includes the second one of the p-type transistor or the n-type transistor. In some embodiments, the master latch includes a second feedback inverter, the second feedback inverter includes a seventh transistor configured to receive the second clock signal and an eighth transistor configured to receive one of the first clock signal or the third clock signal, the seventh transistor includes the first one of the p-type transistor or the n-type transistor, and the eighth transistor includes the second one of the p-type transistor or the n-type transistor. In some embodiments, the first feedback inverter includes fourth and fifth transistors coupled between the first and second transistors, the transmission circuit includes the second transistor, and the master latch includes third and fourth inverters coupled in series and a transmission gate coupled in parallel with the third and fourth inverters and configured to receive the second and third clock signals.

In some embodiments, method of operating a flip-flop circuit includes receiving a first clock signal at a first inverter and at a first transistor of a first feedback inverter of a slave latch of the flip-flop circuit, outputting a second clock signal from the first inverter, receiving the second clock signal at a second inverter and at a second transistor of the first feedback inverter, outputting a third clock signal from the second inverter, and receiving the third clock signal at a third transistor of a transmission circuit of a master latch of the flip-flop circuit. In some embodiments, each of receiving the first clock signal at the first transistor and receiving the third clock signal at the third transistor includes receiving the corresponding first or third clock signal at a first type of a p-type transistor or an n-type transistor, and receiving the second clock signal at the second transistor includes receiving the second clock signal at a second type of the p-type transistor or the n-type transistor. In some embodiments, the method includes receiving the second clock signal at a fourth transistor of the transmission circuit, the fourth transistor including the second type of the p-type transistor or the n-type transistor, receiving the second clock signal at a fifth transistor of a second feedback inverter of the master latch, the fifth transistor including the first type of the p-type transistor or the n-type transistor, and receiving the third clock signal at a sixth transistor of the second feedback inverter, the sixth transistor including the second type of the p-type transistor or the n-type transistor. In some embodiments, the method includes receiving the first clock signal at a fourth transistor of a second feedback inverter of the master latch, the fourth transistor including the second type of the p-type transistor or the n-type transistor, receiving the second clock signal at a fifth transistor of the second feedback inverter, the fifth transistor including the first type of the p-type transistor or the n-type transistor, and receiving the second clock signal at a sixth transistor of the transmission circuit, the sixth transistor including the second type of the p-type transistor or the n-type transistor. In some embodiments, the method includes receiving the first and second clock signals at a transmission gate of the master latch, wherein receiving the second clock signal at the second transistor of the first feedback inverter includes receiving the second clock signal at the second transistor further included in the transmission circuit.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop circuit comprising:
a first inverter configured to receive a first clock signal and output a second clock signal;
a second inverter configured to receive the second clock signal and output a third clock signal;
a master latch comprising a transmission circuit; and
a slave latch comprising a first feedback inverter, wherein the first feedback inverter comprises a first transistor configured to receive the first clock signal and a second transistor configured to receive the second clock signal, and
the transmission circuit comprises a third transistor configured to receive the third clock signal.

2. The flip-flop circuit of claim 1, wherein
each of the first and third transistors comprises a first one of a p-type transistor or an n-type transistor, and
the second transistor comprises a second one of the p-type transistor or the n-type transistor.

3. The flip-flop circuit of claim 2, wherein
the transmission circuit further comprises a fourth transistor configured to receive the second clock signal, and
the fourth transistor comprises the second one of the p-type transistor or the n-type transistor.

4. The flip-flop circuit of claim 2, wherein
the slave latch further comprises a transmission gate,
the transmission gate comprises a fourth transistor configured to receive the second clock signal and a fifth transistor configured to receive the third clock signal,
the fourth transistor comprises the first one of the p-type transistor or the n-type transistor, and
the fifth transistor comprises the second one of the p-type transistor or the n-type transistor.

5. The flip-flop circuit of claim 2, wherein
the master latch further comprises a second feedback inverter,
the second feedback inverter comprises a fourth transistor configured to receive the second clock signal, and
the fourth transistor comprises the first one of the p-type transistor or the n-type transistor.

6. The flip-flop circuit of claim 5, wherein
the second feedback inverter further comprises a fifth transistor configured to receive the third clock signal, and
the fifth transistor comprises the second one of the p-type transistor or the n-type transistor.

7. The flip-flop circuit of claim 5, wherein
the second feedback inverter further comprises a fifth transistor configured to receive the first clock signal, and
the fifth transistor comprises the second one of the p-type transistor or the n-type transistor.

8. The flip-flop circuit of claim 2, wherein
the first feedback inverter further comprises fourth and fifth transistors coupled between the first and second transistors, and
the transmission circuit further comprises the second transistor.

9. The flop circuit of claim 8, wherein the master latch further comprises:
third and fourth inverters coupled in series; and
a transmission gate coupled in parallel with the third and fourth inverters, wherein the transmission gate comprises:
a sixth transistor comprising a p-type transistor configured to receive the second clock signal; and
a seventh transistor comprising an n-type transistor configured to receive the third clock signal.

10. A multi-bit data storage circuit comprising:
a first inverter configured to receive a first clock signal and output a second clock signal;
a second inverter configured to receive the second clock signal and output a third clock signal; and
a series connection of flip-flop circuits, wherein
each flip-flop circuit of the series connection comprises
a master latch comprising a transmission circuit and
a slave latch comprising a first feedback inverter, the first feedback inverter comprises a first transistor configured to receive the first clock signal and a second transistor configured to receive the second clock signal, and the transmission circuit comprises a third transistor configured to receive the third clock signal.

11. The multi-bit data storage circuit of claim 10, wherein each of the first and third transistors comprises a first one of a p-type transistor or an n-type transistor, and the second transistor comprises a second one of the p-type transistor or the n-type transistor.

12. The multi-bit data storage circuit of claim 11, wherein the transmission circuit further comprises a fourth transistor configured to receive the second clock signal, and the fourth transistor comprises the second one of the p-type transistor or the n-type transistor.

13. The multi-bit data storage circuit of claim 12, wherein the slave latch further comprises a transmission gate, the transmission gate comprises a fifth transistor configured to receive the second clock signal and a sixth transistor configured to receive the third clock signal, the fifth transistor comprises the first one of the p-type transistor or the n-type transistor, and the sixth transistor comprises the second one of the p-type transistor or the n-type transistor.

14. The multi-bit data storage circuit of claim 13, wherein the master latch further comprises a second feedback inverter, the second feedback inverter comprises:
  a seventh transistor configured to receive the second clock signal; and
  an eighth transistor configured to receive one of the first clock signal or the third clock signal, the seventh transistor comprises the first one of the p-type transistor or the n-type transistor, and the eighth transistor comprises the second one of the p-type transistor or the n-type transistor.

15. The multi-bit data storage circuit of claim 11, wherein the first feedback inverter further comprises fourth and fifth transistors coupled between the first and second transistors, the transmission circuit further comprises the second transistor, and the master latch further comprises:
  third and fourth inverters coupled in series; and
  a transmission gate coupled in parallel with the third and fourth inverters and configured to receive the second and third clock signals.

16. A method of operating a flip-flop circuit, the method comprising:
  receiving a first clock signal at a first inverter and at a first transistor of a first feedback inverter of a slave latch of the flip-flop circuit;

outputting a second clock signal from the first inverter;

receiving the second clock signal at a second inverter and at a second transistor of the first feedback inverter;

outputting a third clock signal from the second inverter; and receiving the third clock signal at a third transistor of a transmission circuit of a master latch of the flip-flop circuit.

17. The method of claim 16, wherein each of the receiving the first clock signal at the first transistor and the receiving the third clock signal at the third transistor comprises receiving the corresponding first or third clock signal at a first type of a p-type transistor or an n-type transistor, and the receiving the second clock signal at the second transistor comprises receiving the second clock signal at a second type of the p-type transistor or the n-type transistor.

18. The method of claim 17, further comprising:

receiving the second clock signal at a fourth transistor of the transmission circuit, the fourth transistor comprising the second type of the p-type transistor or the n-type transistor;

receiving the second clock signal at a fifth transistor of a second feedback inverter of the master latch, the fifth transistor comprising the first type of the p-type transistor or the n-type transistor; and receiving the third clock signal at a sixth transistor of the second feedback inverter, the sixth transistor comprising the second type of the p-type transistor or the n-type transistor.

19. The method of claim 17, further comprising:

receiving the first clock signal at a fourth transistor of a second feedback inverter of the master latch, the fourth transistor comprising the second type of the p-type transistor or the n-type transistor;

receiving the second clock signal at a fifth transistor of the second feedback inverter, the fifth transistor comprising the first type of the p-type transistor or the n-type transistor; and receiving the second clock signal at a sixth transistor of the transmission circuit, the sixth transistor comprising the second type of the p-type transistor or the n-type transistor.

20. The method of claim 17, further comprising:

receiving the first and second clock signals at a transmission gate of the master latch, wherein the receiving the second clock signal at the second transistor of the first feedback inverter comprises receiving the second clock signal at the second transistor further included in the transmission circuit.

* * * * *